United States Patent
Le Bars et al.

(10) Patent No.: US 7,404,134 B2
(45) Date of Patent: *Jul. 22, 2008

(54) ENCODING/DECODING DEVICE USING A REED-SOLOMON ENCODER/DECODER

(75) Inventors: Philippe Le Bars, Thorigne-Fouillard (FR); Philippe Piret, Cesson-Sevigne (FR); Frédéric Lehobey, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 362 days.

This patent is subject to a terminal disclaimer.

(21) Appl. No.: 10/952,597

(22) Filed: Sep. 29, 2004

(65) Prior Publication Data

US 2005/0138533 A1   Jun. 23, 2005

(30) Foreign Application Priority Data

Sep. 29, 2003   (FR) .................................. 0311365

(51) Int. Cl.
*H03M 13/13* (2006.01)
(52) U.S. Cl. ...................... 714/752; 714/784
(58) Field of Classification Search ................ 714/752, 714/784

See application file for complete search history.

(56) References Cited

U.S. PATENT DOCUMENTS

| | | | |
|---|---|---|---|
| 4,569,051 A * | 2/1986 | Wilkinson | 714/755 |
| 4,607,367 A * | 8/1986 | Ive et al. | 714/755 |
| 4,958,348 A | 9/1990 | Berlekamp et al. | 371/37.1 |

(Continued)

FOREIGN PATENT DOCUMENTS

FR   2851096 A1   2/2003

(Continued)

OTHER PUBLICATIONS

Van Lint, "Algebraic Geometric Codes", in "Coding Theory and Design Theory", 1st Part, *The IMA Volumes in Mathematics and Its Applications* vol. 20, pp. 137-162, Springer-Verlag, Berlin, 1990.

(Continued)

*Primary Examiner*—Stephen M. Baker
(74) *Attorney, Agent, or Firm*—Fitzpatrick, Cella, Harper & Scinto

(57) ABSTRACT

The present invention concerns a device (10) for the encoding of information symbols to transmit or to record, and for the correction of errors among the symbols received or read, according to codes defined over a Galois field $F_q$, where q is an integer greater than 2 and equal to a power of a prime number, and in which a set of elements of $F_q$ are considered which are denoted $y_l(j)$, where $j=1, \ldots, R$ with $1 \leq R \leq q-1$ and $l=0, \ldots, p-1$ with $p>1$. Said device (10) comprises a Reed-Solomon encoder (210), a Reed-Solomon decoder (220) and a unit (500) serving to calculate the inverse of a Vandermonde matrix as well as:

Figure 1:
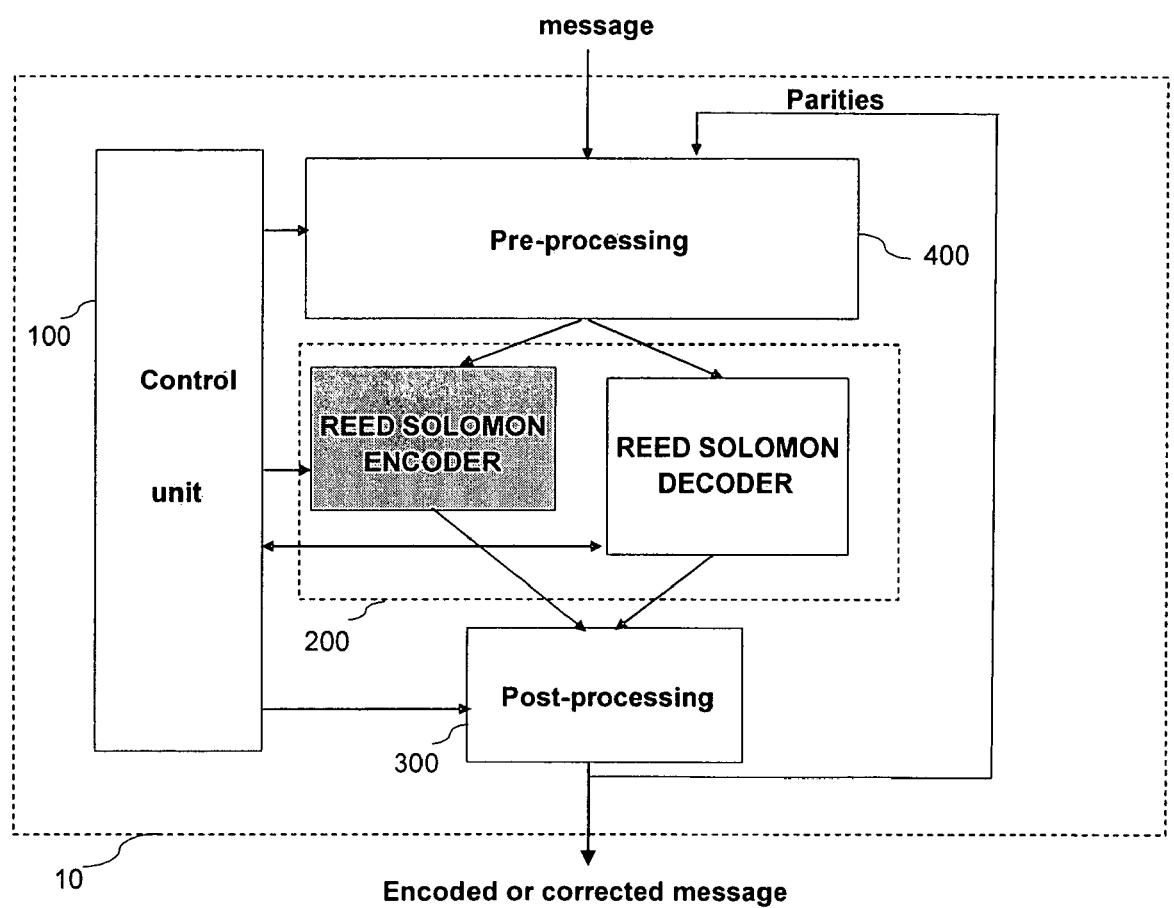

registers "A" (420, 430, 440, 450) in which are stored, for the encoding, said information symbols, and, for the error correction, the symbols received or read after they have been corrected, registers "S" (280, 285, 290, 295) in which are stored, for the encoding, the symbols output from said Reed-Solomon encoder (210), and, for the error correction, the symbols entering said Reed-Solomon decoder (220), and registers "Y" (410, 411, 412, 413) in which said quantities $y_l(j)$ are stored.

24 Claims, 13 Drawing Sheets

U.S. PATENT DOCUMENTS

| | | | | |
|---|---|---|---|---|
| 5,392,299 A * | 2/1995 | Rhines et al. | | 714/756 |
| 5,483,236 A * | 1/1996 | Bi | | 341/94 |
| 5,535,140 A * | 7/1996 | Iwamura | | 701/99 |
| 5,617,541 A * | 4/1997 | Albanese et al. | | 709/207 |
| 5,623,504 A * | 4/1997 | Tolhuizen | | 714/755 |
| 5,872,798 A * | 2/1999 | Baggen et al. | | 714/755 |
| 5,905,739 A | 5/1999 | Piret et al. | | 714/752 |
| 5,942,005 A * | 8/1999 | Hassner et al. | | 714/784 |
| 6,084,918 A | 7/2000 | Piret | | 375/261 |
| 6,226,259 B1 | 5/2001 | Piret | | 370/208 |
| 6,301,307 B1 | 10/2001 | Le Dantec et al. | | 375/261 |
| 6,370,670 B1 | 4/2002 | Le Dantec et al. | | 714/781 |
| 6,378,104 B1 * | 4/2002 | Okita | | 714/784 |
| 6,393,065 B1 | 5/2002 | Piret et al. | | 375/261 |
| 6,400,726 B1 | 6/2002 | Piret et al. | | 370/449 |
| 6,421,806 B1 | 7/2002 | Piret | | 714/777 |
| 6,438,112 B1 | 8/2002 | Piret et al. | | 370/298 |
| 6,449,746 B1 * | 9/2002 | Truong et al. | | 714/784 |
| 6,510,181 B1 | 1/2003 | Piret | | 375/259 |
| 6,542,553 B1 | 4/2003 | Le Dantec et al. | | 375/261 |
| 6,543,021 B1 | 4/2003 | Piret | | 714/752 |
| 6,560,291 B1 | 5/2003 | Piret et al. | | 375/259 |
| 6,560,362 B1 | 5/2003 | Piret et al. | | 382/232 |
| 6,578,170 B1 | 6/2003 | Piret et al. | | 714/758 |
| 6,578,171 B1 | 6/2003 | Braneci et al. | | 714/786 |
| 6,609,223 B1 * | 8/2003 | Wolfgang | | 714/752 |
| 6,634,007 B1 * | 10/2003 | Koetter et al. | | 714/784 |
| 6,638,318 B1 | 10/2003 | Piret et al. | | 714/781 |
| 6,732,325 B1 * | 5/2004 | Tash et al. | | 714/785 |
| 6,766,489 B1 | 7/2004 | Piret et al. | | 714/755 |
| 6,832,042 B1 * | 12/2004 | Shieh | | 386/125 |
| 6,842,871 B2 | 1/2005 | Piret et al. | | 714/701 |
| 6,877,125 B2 | 4/2005 | Le Bars et al. | | 714/755 |
| 6,898,251 B2 | 5/2005 | Le Bars et al. | | 375/295 |
| 6,910,006 B2 | 6/2005 | Piret | | 704/203 |
| 7,089,276 B2 * | 8/2006 | Miller et al. | | 708/492 |
| 2002/0060873 A1 | 5/2002 | Kondo et al. | | 360/53 |
| 2002/0071496 A1 | 6/2002 | Ehrmann | | 375/295 |
| 2002/0099997 A1 | 7/2002 | Piret | | 714/781 |
| 2003/0070134 A1 * | 4/2003 | Ivry | | 714/784 |
| 2003/0177430 A1 | 9/2003 | Piret | | 714/755 |
| 2003/0212945 A1 * | 11/2003 | Sundaram et al. | | 714/781 |
| 2004/0039978 A1 | 2/2004 | Lehobey et al. | | |
| 2004/0117718 A1 * | 6/2004 | Manasse | | 714/781 |
| 2004/0117719 A1 | 6/2004 | Lehobey et al. | | 714/785 |
| 2004/0194006 A1 | 9/2004 | Piret et al. | | 714/781 |
| 2004/0260994 A1 * | 12/2004 | Winograd et al. | | 714/752 |
| 2005/0015704 A1 | 1/2005 | Piret et al. | | 714/781 |
| 2005/0076285 A1 * | 4/2005 | Silvus et al. | | 714/755 |

FOREIGN PATENT DOCUMENTS

| | | |
|---|---|---|
| FR | 2849514 A1 | 4/2003 |
| WO | WO 2004/047306 | 6/2004 |
| WO | WO 2004/070956 | 8/2004 |

OTHER PUBLICATIONS

Høholdt et al., "*On the Decoding of Algebraic-Geometric Codes*", IEEE Transactions on Information Theory, vol. 41, No. 6, pp. 1589-1614, Nov. 1995.

Seroussi, "*A Systolic Reed-Solomon Encoder*", IEEE Transactions on Information Theory, vol. 37, No. 4, pp. 1217-1220, Jul. 1991.

Wicker et al., "Solomon Codes and Their Applications", IEEE Press 1994.

Liu Feng et al. "Algebraic geometry codes from Reed Solomon Codes", Southeastcon, 1996. Bringing Together Education, Science and Technology, Proceedings of the IEEE Tampa, FL, USA, Apr. 1996, New York, New York, pp. 231-237.

Mastrovito, "VLSI Architectures for Computations in Galois Fields", Ph.D Dissertation, Linköping University, Sweden, pp. 1-247, 1991.

R.E. Blahut, "Theory and Practice of Error-Control Codes", Addison-Wesley, Reading, MA, pp. 161-193, 1983.

Youshi Xu, et al. "Variable Shortened-and-Punctured Reed-Solomon Codes for Packet Loss Protection", IEEE Transactions on Broadcasting, vol. 48, No. 3, pp. 237-245, Sep. 2002.

M. Anwarul Hasan et al., "Algorithms and Architectures for the Design of a VLSI Reed-Solomon Codec", Reed-Solomon Codes and Their Applications, Chapter 5, pp. 60-107, 1994.

* cited by examiner

ENCODING/DECODING DEVICE USING A REED-SOLOMON ENCODER/DECODER

The present invention concerns systems for communication or recording of data in which the data are subjected to a channel encoding in order to improve the fidelity of the transmission or storage.

The invention concerns more particularly the practical implementation of linear codes defined over a Galois field, of generalized Reed-Solomon codes, and of algebraic geometric codes. The general technical problem is the obtainment of algorithms that are less complex, the complexity being defined here either as the number of operations to be performed when the calculation is implemented according to a program, or as the number of logic gates utilized during the calculation by an integrated circuit. The first reduction requires putting circuits in parallel and thus an increase in the number of gates, the second reduction often leads to an increase in the total processing time. The emphasis is placed here on the reduction in the complexity in terms of numbers of gates, since the predominant problem with hard disks currently is the cost per storage unit, the hard disks being products for mass usage. The object is in particular to find the most "efficient" device for this. In the context of the invention, "efficiency", is essentially used to mean the fact of requiring the smallest possible number of hardware components. Where appropriate, means will nevertheless be envisaged for accelerating the calculations, at the cost of a slight increase in the number of hardware components.

It will be recalled that channel "block encoding" consists, when the "codewords" sent to a receiver or recorded on a data carrier are formed, of introducing a certain level of redundancy in the data. More particularly, by means of each codeword, the information is transmitted that is initially contained in a predetermined number k of symbols taken from an "alphabet" of finite size q; on the basis of these k information symbols, calculation is made of a number n>k of symbols belonging to that alphabet, which constitute the components of the codewords: $\underline{v} \equiv (v_0, v_1, \ldots, v_{n-1})$: (the symbol "$\equiv$" means "by definition"). The set of codewords obtained when each information symbol takes some value in the alphabet constitutes a sort of dictionary referred to as a "code" of "dimension" k and "length" n.

When the size q of the "alphabet" is a power of a prime number, the alphabet can be given the structure of what is known as a "Galois field" denoted $F_q$, of which the non-zero elements may conveniently be identified as each being equal to $\gamma^{i-1}$ for a corresponding value of i, where i=1, ..., q−1, and where γ is a primitive $(q-1)^{th}$ root of unity in $F_q$.

In particular, certain codes, termed "linear codes" are such that any linear combination of codewords (with the coefficients taken from the alphabet) is still a codeword. These codes may conveniently be associated with a matrix H of dimension (n−k)×n, termed "parity check matrix": a word $\underline{v}$ of given length n is a codeword if, and only if, it satisfies the relationship: $H \cdot \underline{v}^T = 0$ (where the exponent T indicates the transposition); the code is then said to be "orthogonal" to the matrix H.

At the receiver, the associated decoding method then judiciously uses this redundancy to detect any transmission errors and if possible to correct them. There is a transmission error if the difference $\underline{e}$ between a received word $\underline{r}$ and the corresponding codeword $\underline{v}$ sent by the transmitter is non-zero.

More particularly, the decoding is carried out in two main steps.

The first step consists of associating an "associated codeword" with the received word. To do this, the decoder first of all calculates the vector of "error syndromes" $H \cdot \underline{r}^T = H \cdot \underline{e}^T$. If the syndromes are all zero, it is assumed that no transmission error has occurred, and the "associated code word" will then simply be taken to be equal, to the received word. If that is not the case, it is thereby deduced that certain symbols in the received word are erroneous, and a correction algorithm is then implemented which is adapted to estimate the value of the error $\underline{e}$; the algorithm will thus provide an estimated value $\hat{\underline{e}}$ such that ($\underline{r} - \hat{\underline{e}}$) is a codeword, which will then constitute the associated codeword.

The second step simply consists in reversing the encoding method. In the ideal situation in which all the transmission errors have been corrected, the initial information symbols are thereby recovered.

The purpose of an error correction algorithm is to associate with the received word the codeword situated at the shortest Hamming distance from that received word, the "Hamming distance" being, by definition, the number of places where two words of the same length have a different symbol. The shortest Hamming distance between two different codewords of a code is termed the "minimum distance" d of that code. This is an important parameter of the code. More particularly, it is in principle possible to find the position of the possible errors in a received word, and to provide the correct replacement symbol (i.e. that is identical to that sent by the transmitter) for each of those positions, each time the number of erroneous positions is at most equal to INT[(d−1)/2] (where "INT" designates the integer part) for a code of minimum distance d (for certain error configurations, it is sometimes even possible to achieve better). However, in all cases, the concern is not with a possibility in principle, since it is often difficult to develop a decoding algorithm achieving such performance. It should also be noted that, when the chosen algorithm manages to propose a correction for the received word, that correction is all the more reliable (at least, for most transmission channels) the smaller the number of positions it concerns.

Among known codes, those known as "Reed-Solomon codes" may be cited, which are reputed for their efficacy, and which the present invention will greatly refer to. They are linear codes, of which the minimum distance d is equal to (n−k+1). The parity check matrix H of the Reed-Solomon code of dimension k and length n (where n is necessarily equal to (q−1) or a divisor of (q−1)) is a matrix with (n−k) lines and n columns, which has the structure of a Vandermonde matrix. This parity check matrix H may for example be defined by taking $H_{ij} = \alpha^{(i+1)j}$ ($0 \leq i \leq n-k-1$, $0 \leq j \leq n-1$), where α is an $n^{th}$ root of unity in $F_q$.

Among the algorithms known for encoding a sequence $\underline{a} = (a_0, a_1, \ldots, a_{k-1})$ of information symbols belonging to $F_q$ by means of a Reed-Solomon code, certain use that parity check matrix H. In these algorithms, a certain relationship is chosen between the information symbols and those of the corresponding codeword $\underline{v}$ (for example $v_i = a_i$ for $0 \leq i \leq k-1$; in this case, the encoding is said to be "systematic"). Next the components of $\underline{v}$ remaining to be determined are calculated using the matrix equation $H \cdot \underline{v}^T = 0$: it is thus necessary to solve (n−k) linear equations over $F_q$.

To decode Reed-Solomon codes, a so-called "Berlekamp-Massey" algorithm is usually employed for the detection of the erroneous positions in a received word, and a so-called "Forney" algorithm for the correction of the corresponding erroneous symbols. For more details on Reed-Solomon codes, reference may for example be made to the work by R. E. Blahut entitled "*Theory and practice of error-control codes*", Addison-Wesley, Reading, Mass.,1983.

For modern information carriers, for example on computer hard disks, CDs ("compact discs") and DVDs ("digital video discs"), it is sought to increase the density of information. When such a carrier is affected by a physical defect such as a scratch, a high number of information symbols may be rendered unreadable. This problem may nevertheless be remedied by using a very long code. However, Reed-Solomon codes have the particularity that the length n of the codewords is necessarily less than or equal to the size q of the alphabet of the symbols.

Consequently, if a Reed-Solomon code is desired having codewords of great length, high values of q must be envisaged, which leads to costly implementations in terms of calculation and storage in memory. Moreover, high values of q are sometimes ill-adapted to the technical application envisaged. For this reason, we have sought to build codes which naturally provide words of greater length than Reed-Solomon codes.

In particular so-called "algebraic geometric codes" or "Goppa geometric codes" have recently been proposed (see for example "*Algebraic Geometric Codes*" by J. H. van Lint, in "*Coding Theory and Design Theory*" $1^{st}$ part, *IMA Volumes Math. Appl.*, volume 20, Springer-Verlag, Berlin, 1990). These codes are constructed from a set of n pairs (x,y) of symbols belonging to a chosen Galois field $F_q$; this set of pairs is termed a "locating set". A parity check matrix is then defined such that each line of that matrix is obtained by evaluating a judiciously chosen function of two variables X and Y in each element of that locating set.

In general terms, there is an algebraic equation with two unknowns X and Y such that the pairs (x,y) of that locating set are all solutions of that algebraic equation. The values of x and y of these pairs may be considered as coordinates of points forming an "algebraic curve".

An important parameter of such a curve is its "genus" g. In the particular case where the curve is a simple straight line (the genus g is then zero), the algebraic geometric code reduces to a Reed-Solomon code. In certain cases, algebraic geometric codes make it possible to achieve a length equal to $(q+2g\sqrt{q})$, which may be very high; for example, with an alphabet length of 256 and a genus equal to 120, codewords are obtained of length 4096. It should moreover be noted that algebraic geometric codes have a minimum distance d greater than or equal to (n−k+1−g).

Like all codes, algebraic geometric codes may be "shortened". It is said that a given code is a "shortened" version of the code C if it comprises solely the words of C of which, for a number v of predetermined positions (not necessarily consecutive), the components are all zero: as these positions are known to the receiver, their transmission can be obviated, such that the length of the shortened code is (n−v). In particular, it is common to shorten an algebraic geometric code by removing from the locating set, where possible, one or more points for which the x coordinates are zero.

An algebraic geometric code example will now be presented. An algebraic geometric code will thus be considered with length 572 and dimension 512 defined, in conventional manner as follows.

The alphabet of the symbols is constituted by the $2^8$ elements of the Galois field $F_{256}$ (i.e. by bytes of binary symbols) (this field may be constructed with the aid of the polynomial $(X^8+X^4+X^3+X^2+X1)$ defined over $F_2$).

The following algebraic curve is then considered of genus g=12 constituted by the set of the solutions in $F_{256}$ of the equation with two unknowns:

$$Y^4+Y=X^9+X^6+X^5+X^2+X.$$

For any value taken by X in $F_{256}$, the p=4 solutions of the corresponding equation in Y are also in $F_{256}$. These solutions (X,Y) define the "points of the curve" associated with that equation over $F_{256}$. This curve comprises 576 points of finite coordinates (as well as a point $P_\infty$ at infinity). From this set, the four solutions of the equation for which X=0 are erased, in order to construct a "shortened" code. The set of the remaining points $P_j$ (where j=1,0.572) will thus constitute the locating set, each point $P_j$ serving to identify the $j^{th}$ element of any codeword.

Next, the vector space $L(mP_\infty)$ is considered of polynomials in X and Y with coefficients in $F_{256}$ of which solely the poles are situated in $P_\infty$, and are of order less than or equal to m, where m is a strictly positive integer (it is thus a so-called "one-point" algebraic geometric code). This vector space, which is of dimension greater than or equal to (m−g+1) (equal if m≧2g−2), has a base constituted by the monomials $(X^rY^s)$, where r is a positive integer or zero, s is an integer between 0 and 3, and: 9s+4r≦m.

Conventionally a parity check matrix is defined in the following manner: the element in line i and column j of this matrix is equal to the $j^{th}$ monomial of said base (with 1≦j≦m−g+1) evaluated at the point $P_j$ (with j=1, . . . ,572) of the algebraic curve. Take for example: m=71; we then obtain n−k=60, and thus k=512.

Algebraic geometric codes are advantageous as to their minimum distance, and, as has been said, as to the length of the codewords, but they have the drawback of requiring decoding algorithms that are rather complex, and thus rather expensive in terms of equipment (software and/or hardware) and processing time. This complexity is in fact greater or lesser according to the algorithm considered, a greater complexity being in principle the price to pay for increasing the error correction capability of the decoder (see for example the article by Tom Høholdt and Ruud Pellikaan entitled, "*On the Decoding of Algebraic-Geometric Codes*", *IEEE Trans. Inform. Theory*, vol. 41 no. 6, pages 1589 to 1614, November 1995).

Codes have been recently proposed defined over a Galois field $F_q$, where q is an integer greater than 2 and equal to a power of a prime number, belonging to an algebraic geometric code, and for which relatively simple encoding and/or decoding methods exist by virtue of the fact that these codes may be reduced to a plurality of Reed-Solomon codes that may possibly be shortened.

For these codes, a certain set $(x_1, x_2, \ldots, x_R)$ is considered of distinct preferably non-zero elements of a chosen Galois field. An integer p>1 and a p-tuple of integers $(t_0, \ldots, t_{p-1})$ are chosen such that $$q-1 > t_0 > t_1 > \ldots > t_{p-1} > 0.$$

These codes are of length n=pR (unless shortened), and of redundancy $$n-k = \sum_{l=0}^{p-1} t_l.$$

A p-tuple $(Y_0, \ldots, Y_{p-1})$ of diagonal square matrices of dimension R on $F_q$ is also considered such that, for all j (1≦j≦R), the p elements $y_l(j)$ in position (jj) of these matrices $Y_l$ (l=0, . . . , p−1) are all different from each other (except in the case of shortening, where the values $y_l(j)$ for the shortened positions n° j are arbitrary).

It will be noted that, in the case in which the pairs $(x_j, y_l(j))$ (in which j=1, . . . , R, and l=0, . . . , p−1) are all solutions of a certain algebraic equation, it is possible, on the basis of the value of the genus g of the algebraic curve, obtain a lower bound (n−k+1−g) for the minimum distance of that code.

Finally, the plurality of Reed-Solomon codes, mentioned above, that may possibly be shortened, is associated with the parity matrices $H^{(t_l)}$ (l=0, . . . , p−1) which have the form $$H^{(w)} \equiv \begin{bmatrix} 1 & 1 & \ldots & 1 \\ x_1 & x_2 & \ldots & x_R \\ \vdots & \vdots & \vdots & \vdots \\ x_1^{w-1} & x_2^{w-1} & \ldots & x_R^{w-1} \end{bmatrix} \quad (1)$$

for any strictly positive integer w. This matrix $H^{(w)}$ is clearly a Vandermonde matrix, but it only corresponds to an unshortened Reed-Solomon code if, as mentioned above, the number of columns (equal to R) is equal to (q−1) or to a divisor of (q−1).

More particularly, concerning the encoding of information symbols, the following codeword is formed $$\underline{v} \equiv [\underline{v}_0 \underline{v}_1 \ldots \underline{v}_{p-1}],$$

where each word $\underline{v}_l$ (l=0, . . . , p−1) is of length R, obeying the following system of equations $$\begin{cases} \underline{v}_0 + \underline{v}_1 + \ldots + \underline{v}_{p-1} = \underline{u}_0, \\ \underline{v}_0 Y_0 + \underline{v}_1 Y_1 + \ldots + \underline{v}_{p-1} Y_{p-1} = \underline{u}_1, \\ \underline{v}_0 Y_0^2 + \underline{v}_1 Y_1^2 + \ldots + \underline{v}_{p-1} Y_{p-1}^2 = \underline{u}_2, \\ \ldots \\ \underline{v}_0 Y_0^{p-1} + \underline{v}_1 Y_1^{p-1} + \ldots + \underline{v}_{p-1} Y_{p-1}^{p-1} = \underline{u}_{p-1}, \end{cases} \quad (2)$$

where each word $\underline{u}_l$ is of length R and is orthogonal to the matrix $H^{(t_l)}$, that is to say, $$H^{(t_l)} \cdot \underline{u}_l^T = 0, \text{ for } l=0, \ldots, p-1. \quad (3)$$

It is possible, if desired, to consider that the words $\underline{u}_l$ are components of a "pre-encoded word" $\underline{u} \equiv [\underline{u}_0 \underline{u}_1 \ldots \underline{u}_{p-1}]$ of length n=pR. For any word $\underline{u}_l$ or $\underline{v}_l$ (where l=0, . . . , p−1), the designation "position-X" will be given to the integer (j−1) serving as index for the $j^{th}$ component of the word.

For example such a method is known from the application FR-0301546. In this method, the encoding is "systematic", that is to say that in each word $\underline{v}_l$, the (R−$t_l$) first symbols are information symbols (and one or more zeros if the code is shortened), whereas the $t_l$ last symbols are redundancy symbols calculated by means of equations (2) and (3). More particularly, this calculation of the redundancy symbols implies a progressive construction, in parallel and by return trips, of the words $\underline{u} = [\underline{u}_0 \underline{u}_1 \ldots \underline{u}_{p-1}]$ and $\underline{v} \equiv [\underline{v}_0 \underline{v}_1 \ldots \underline{v}_{p-1}]$; a detailed explanation of this construction is to be found in said French application FR-0301546.

It is desirable to shorten the code, for example, when it is desired to rely on an algebraic equation which does not have, for all $x_j$ belonging to ($x_1, x_2, \ldots, x_R$), the same number p>1 of distinct solutions ($x_j, y_l(j)$). It is thus possible to attribute the value zero to the components of $\underline{v}_1$ of which the position-X (j−1) corresponds to a value $x_j$ associated with a single solution ($x_j, y_l(j)$) of the algebraic equation; similarly, the value zero will be attributed to the components of $\underline{v}_2$ of which the position-X (j−1) corresponds to a value $x_j$ exactly associated with one solution or exactly two distinct solutions ($x_j, y_l(j)$) of the algebraic equation; and so forth, up to the word $\underline{v}_{p-1}$, where, consequently, the only non-zero components will be those of which the position-X (j−1) corresponds to a value $x_j$ associated with p distinct solutions ($x_j, y_l(j)$) of the algebraic equation. In this manner, after erasure of the systematically zero components in the codewords $\underline{v}$, it will be possible to place in one-to-one relationship the series of components of the shortened words so obtained and the series of solutions of the algebraic equation where X takes one of the values ($x_1, x_2, \ldots, x_R$). In this case, for the elements of the matrices $Y_l$ (where l=0, . . . , p−1) mentioned above, naturally the corresponding value of Y will be given to $y_l(j)$, when a solution ($x_j, y_l(j)$) to the algebraic equation exists; otherwise the value $y_l(j)$ matters little.

Turning now to the decoding, application FR-0304767 discloses a method of correcting errors in the received words $$\underline{r} \equiv [r(x_1, y_0(1)), \ldots, r(x_1, y_{p-1}(1)), \ldots, r(x_R, y_{p-1}(R))],$$

of length n=pR, in which certain components may be erased (an "erased" component is a component for which there are reasons to believe that its value is erroneous). It is said that the components r($x_j, y_l(j)$), where j is fixed and l=0, . . . , p−1, form an "aggregate".

This method comprises the following steps:
a) for s=0, . . . , p−1:
calculating the word $$\underline{r}_s \equiv [r_s(x_1), r_s(x_2), \ldots, r_s(x_R)],$$

of length R, in which, for j=1, . . . , R, the "aggregate symbol"

$$r_s(x_j) \equiv \sum_{l=0}^{p-1} [y_l(j)]^s r(x_j, y_l(j))$$

is erased if at least one of the symbols r($x_j, y_l(j)$) is itself erased, and
calculating the error syndrome vector $\underline{\sigma}_s \equiv H^{(t_s)} \underline{r}_s^T$,
b) attempting to calculate a word $\underline{\hat{v}}_0 \equiv [\hat{v}_0(x_1), \hat{v}_0(x_2), \ldots, \hat{v}_0(x_R)]$ by correcting the word $\underline{r}_0$ according to the error syndrome vector $\underline{\sigma}_0$ by means of an error correction algorithm adapted to take into account erasures,
c) for s=1, . . . , p−1:
erasing, where the preceding error correction attempt has succeeded, for all x such that $\hat{v}_{s-1}(x) \neq r_{s-1}(x)$, the symbols $r_f(x)$ for f=s, . . . , p−1, and
attempting to calculate a word $\underline{\hat{v}}_s \equiv [\hat{v}_s(x_1), \hat{v}_s(x_2), \ldots, \hat{v}_s(x_R)]$ by correcting the word $\underline{r}_s$ according to the error syndrome vector $\underline{\sigma}_s$ by means of an error correction algorithm adapted to take into account erasures, and
d) calculating, where the above p correction attempts have succeeded, for j=1, . . . , R, the symbols $\hat{v}(x_j, y_l(j))$ (where l=0, . . . , p−1), which are respectively the estimations of the sent symbols corresponding to the received symbols r($x_j, y_l(j)$), by solving the system of p equations:

$$\hat{v}_s(x_j) \equiv \sum_{l=0}^{p-1} [y_l(j)]^s \hat{v}(x_j, y_l(j)), \text{ for } s=0, \ldots, p-1. \quad (4)$$

For any word $\underline{r}_s$ or $\underline{\hat{v}}_s$ (where s=0, . . . , p−1), the designation "position-X" will be given to the integer (j−1) serving as index for the $j^{th}$ component of the word.

It will be noted that in the context of the present invention, the term "decoding" will be used for brevity to designate solely the step of error correction in the received words, it being understood that the person skilled in the art knows how to subsequently perform the removal of the redundancy without difficulty using some conventional device.

As can be seen, the steps of an encoding method as described above have few similarities with the steps of a decoding method as described above (which is hardly surprising). However, the authors of the present invention have realized that it was possible to organize these two methods so as to make profound analogies become apparent. To do this, they distinguished in both cases the so-called "pre-processing" steps and the so-called "post-processing" steps.

Thus, the encoding comprises implementation
of pre-processing steps i.e.:
attributing information symbol values to the (R−$t_l$) first components of each word $\underline{v}_l$,
transmitting these words to the Reed-Solomon encoder for the calculation of the parities (see equations (3)) (one equation for each pre-processing step), and
preparing registers for solving the system of equations (2) depending on the coefficients appearing on the left side of each of these equations (one equation for each step of pre-processing), and
post-processing steps i.e.:
reading both the data resulting from the pre-processing as well as the words coming from the Reed-Solomon encoder,
reading the values of the symbols $y_l(j)$, and
solving the system of equations (2).
The decoding-comprises implementation
of pre-processing steps i.e.:
calculating the aggregate symbols (see step a)),
transmitting these aggregate symbols to the Reed-Solomon decoder, and
preparing registers for solving the system of equations (4) depending on the coefficients appearing on the right side of each of these equations (one equation for each step of pre-processing), and
of post-processing steps i.e.:
reading the data resulting from the pre-processing as well as reading the words coming from the Reed-Solomon decoder (see steps b) and c)) (one equation for each post-processing step),
reading the values of the symbols $y_l(j)$, and
solving the system of equations (4) (see step d)).

On the basis of this analogy of operation, the invention concerns a device for the encoding of information symbols to transmit or to record, and the correction of errors among the symbols received or read, according to codes defined over a Galois field $F_q$, where q is an integer greater than 2 and equal to a power of a prime number, and in which a set of elements of $F_q$ are considered which are denoted $y_l(j)$, where j=1, . . . , R with 1≦R≦q−1 and l=0, . . . , p−1 with p>1. This device comprises, in known manner, a Reed-Solomon encoder, a Reed-Solomon decoder and a unit serving to calculate the inverse of a Vandermonde matrix. This device is remarkable in that it further comprises:
registers "A" in which there are stored
for the encoding, said information symbols; and
for the error correction, the symbols received or read after they have been corrected,
registers "S" in which there are stored
for the encoding, the symbols output from said Reed-Solomon encoder, and
for the correction of errors, the symbols input to said Reed-Solomon decoder, and
registers "Y" in which said quantities $y_l(j)$ are stored.

Thus, according to the invention, the registers "A" serve for the pre-processing for the encoding, and for the post-processing for the decoding; the registers "S" serve for the post-processing for the encoding, and for the pre-processing for the decoding; and the registers "Y" serve for the pre-processing and for the post-processing, both for the encoding and for the decoding.

In other words, the judicious organization according to the invention of the encoding operations and the decoding operations means that it is possible to use exactly the same circuits for the encoding and for the decoding. This represents an advantageous saving in terms of number of hardware components with respect to a routine implementation of circuits adapted both for the encoding and for the decoding, and, naturally, an even more considerable saving with respect to an implementation in which the encoding module and the decoding module are two distinct modules.

Furthermore, the invention makes it possible to use a conventional Reed-Solomon encoder, that is to say of length (q−1) if the alphabet is $F_q$.

According to particular features, said Reed-Solomon decoder is of length (q−1), and the device according to the invention comprises a "conversion-X table" which matches the indices of any register of length R with the respective elements of the Galois field $F_q$. More specifically, this conversion-X table associates with each position-X of a register of length R the corresponding value $x_j$. This is because the Reed-Solomon decoder indicates positions of errors with respect to a frame comprising (q−1) components; when R<q−1, in order to shift the register which must be updated, it is necessary to take into account the missing positions.

By virtue of these provisions, it is possible to use a conventional Reed-Solomon decoder in the device according to the invention.

According to one embodiment of the invention, the powers $y_l(j)^s$ of the symbols $y_l(j)$, where s=2, . . . , p−1, are also stored in said "Y" registers. These powers may then be conveniently read during the post-processing steps.

As a variant, the device also comprises multiplier circuits making it possible to calculate the powers $y_l(j)^s$ of the symbols $y_l(j)$, where s=2, . . . , p−1. This calculation is performed during the post-processing steps, after the values of those symbols have been read in the registers "Y". This variant thus requires supplementary circuits, but fewer memory registers than in the above embodiment.

According to other particular features, the device according to the invention is provided with a state machine adapted to organize the activation and deactivation of all the signals driving the encoding and error correcting operations.

By virtue of these provisions, the device according to the invention is both compact and efficient.

The invention also relates to:
a computer program containing instructions adapted to operate a control unit of the device according to the invention, when that control unit is implemented in the form of a data processing device,
an apparatus for sending and receiving encoded digital signals, comprising means for modulating said encoded digital signals, a modulated data transmitter, a modulated data receiver, means for demodulating said encoded digital signals, and means for calculating the estimated information symbols from the corrected received words, said apparatus being remarkable in that it comprises a device as described succinctly above, and an apparatus for recording and reading encoded digital signals, comprising means for modulating said encoded digital signals, a modulated data recorder, a modulated data reader, means for demodulating said encoded digital signals, and means for calculating the estimated information symbols from the corrected read words, said apparatus being remarkable in that it comprises a device as described succinctly above.

Figure 2:
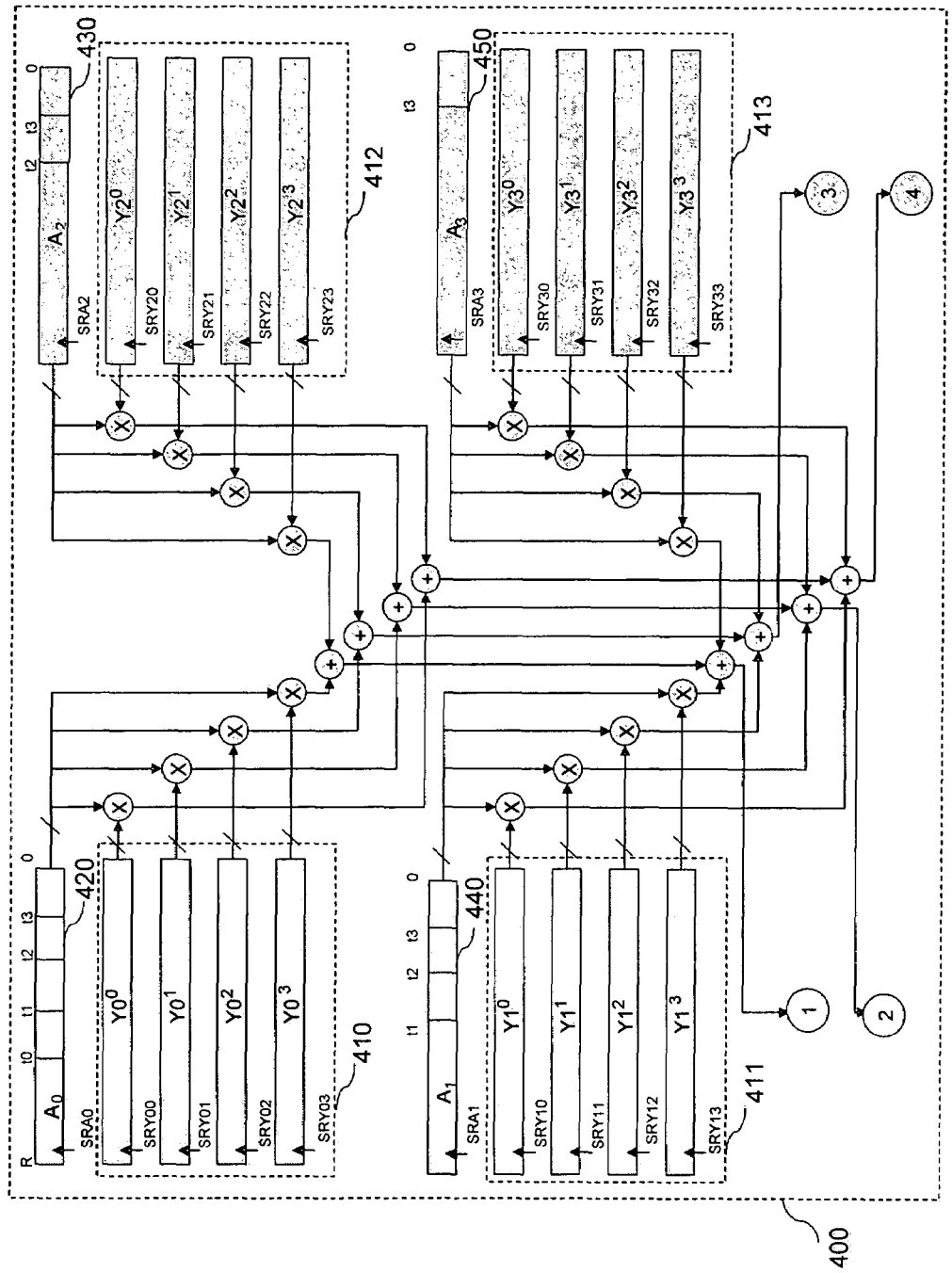
Figure 3:
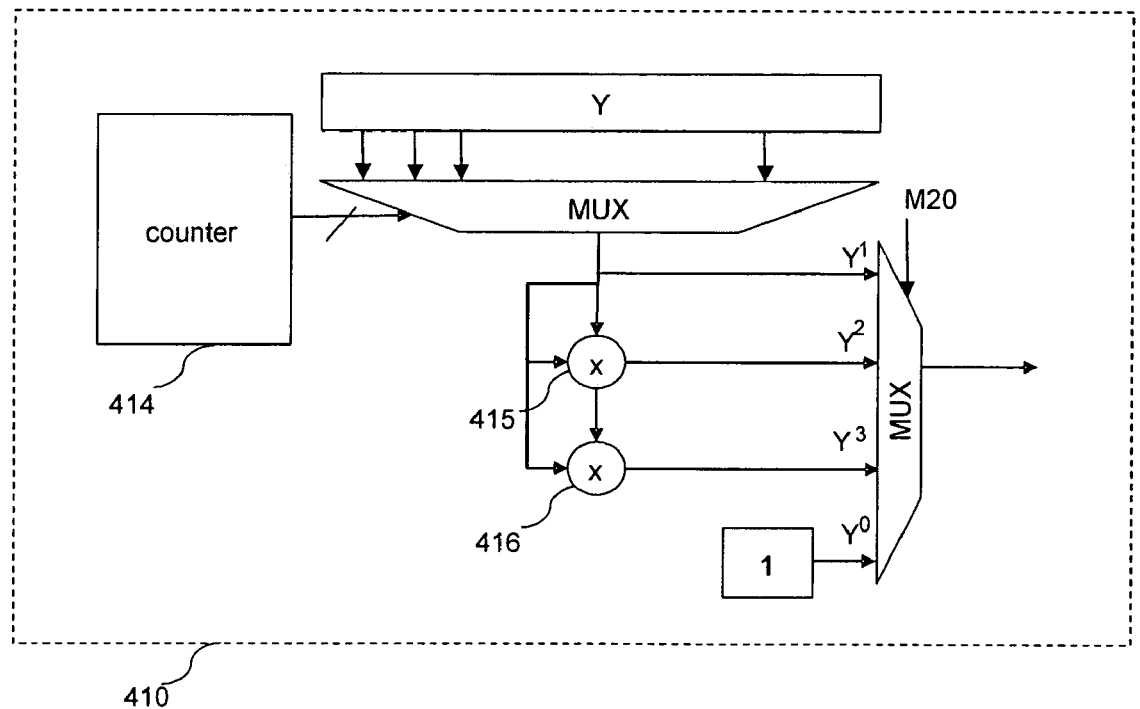
Figure 4:
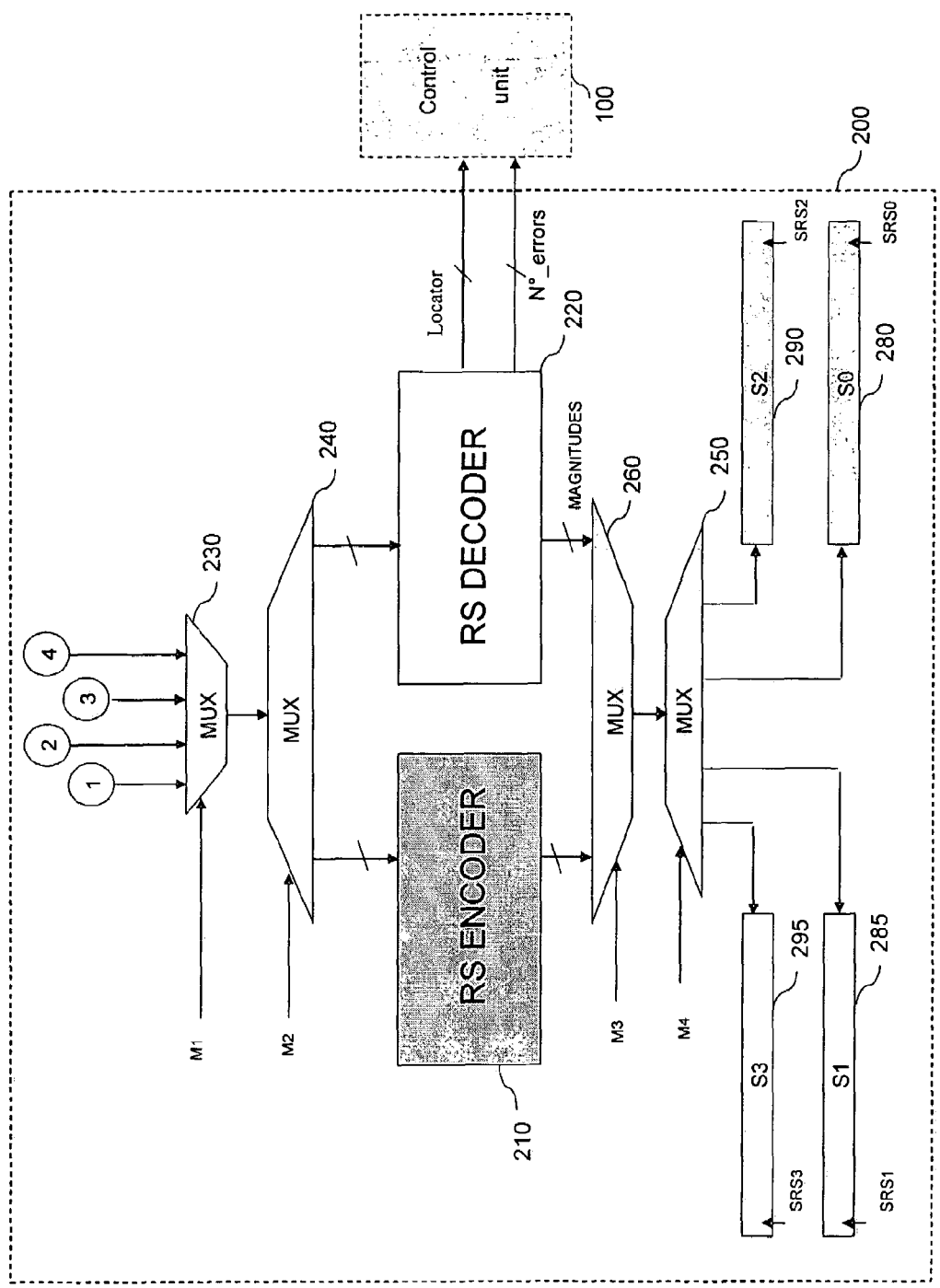
Figure 5:
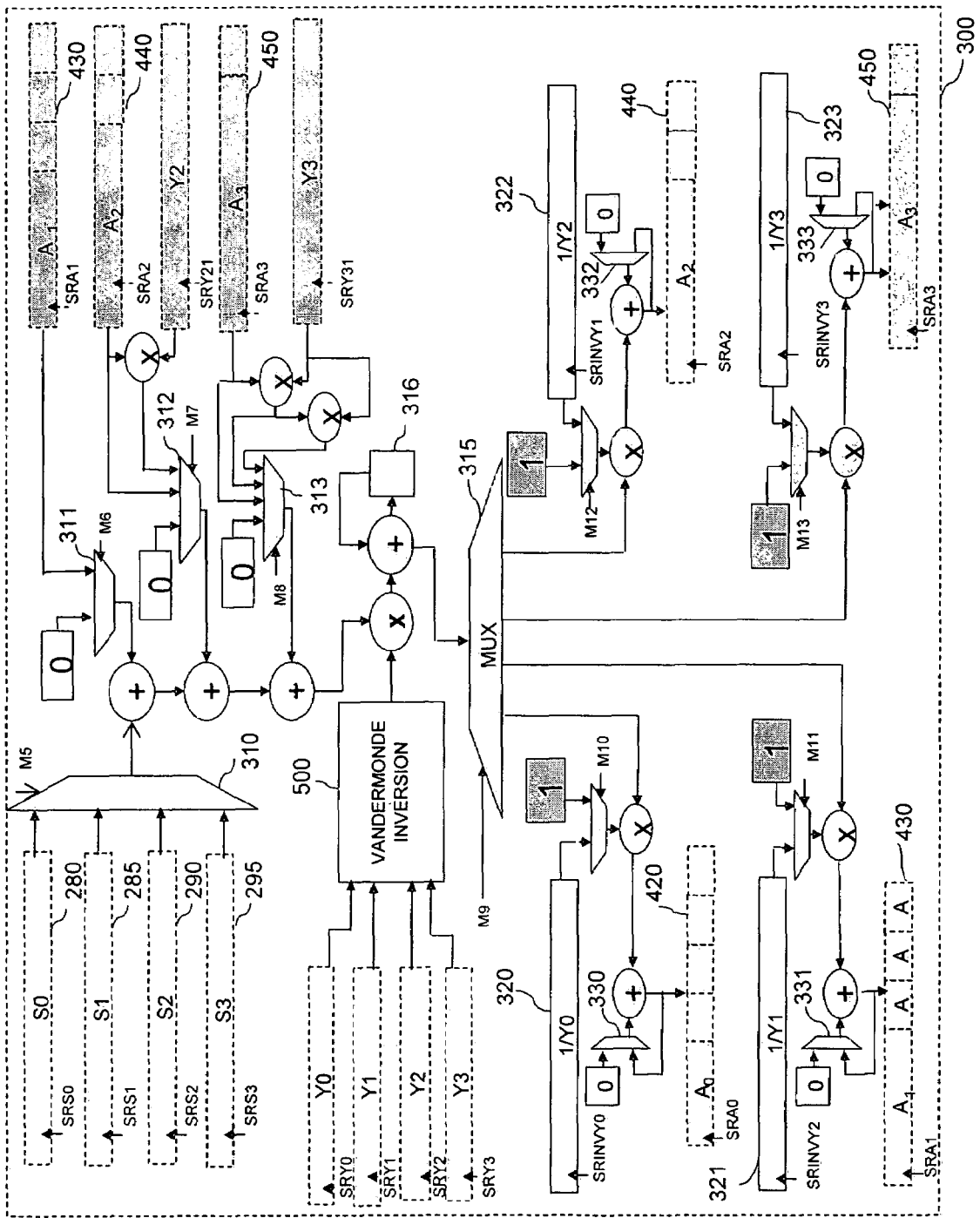
Figure 6:
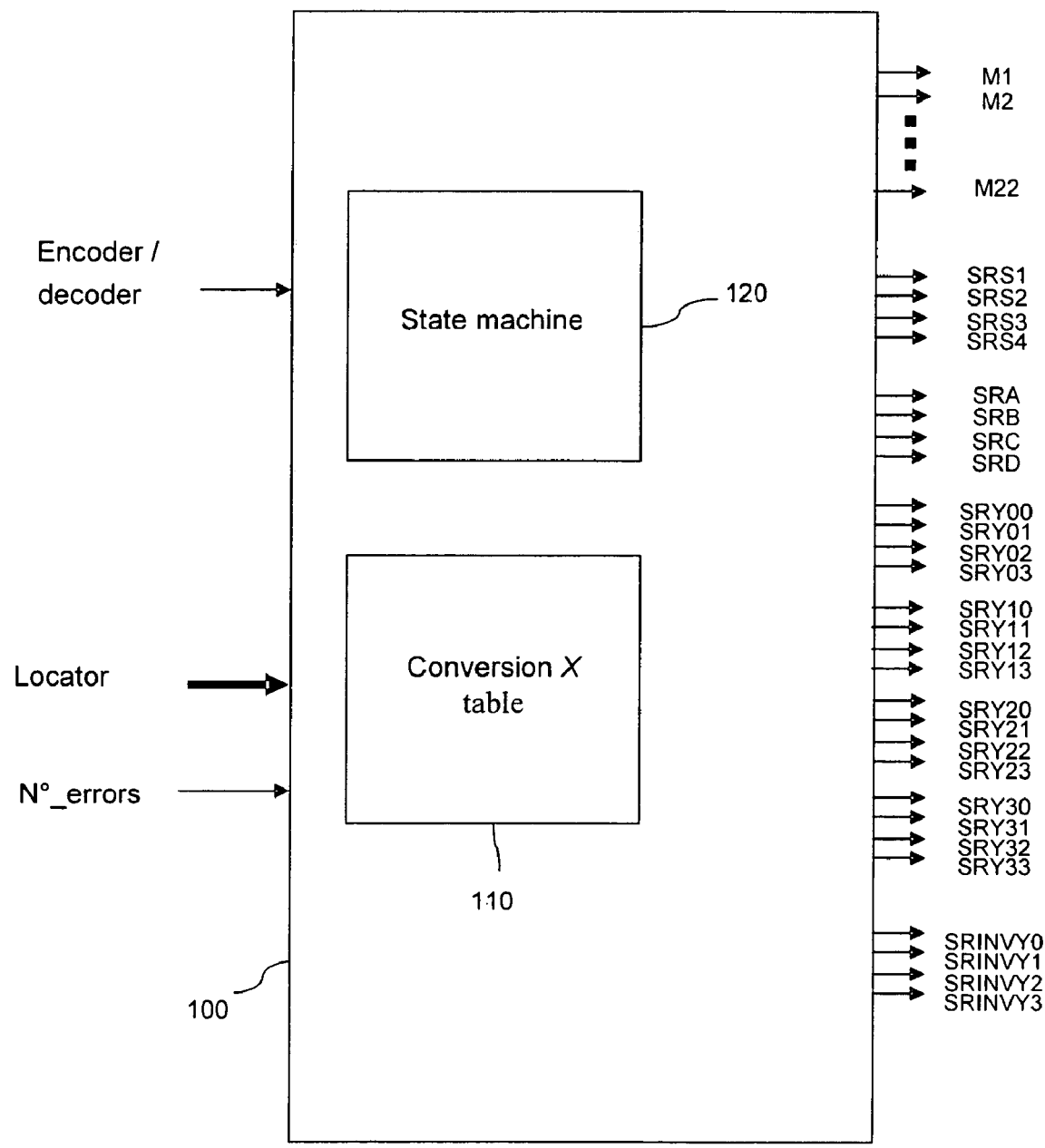
Figure 7A:
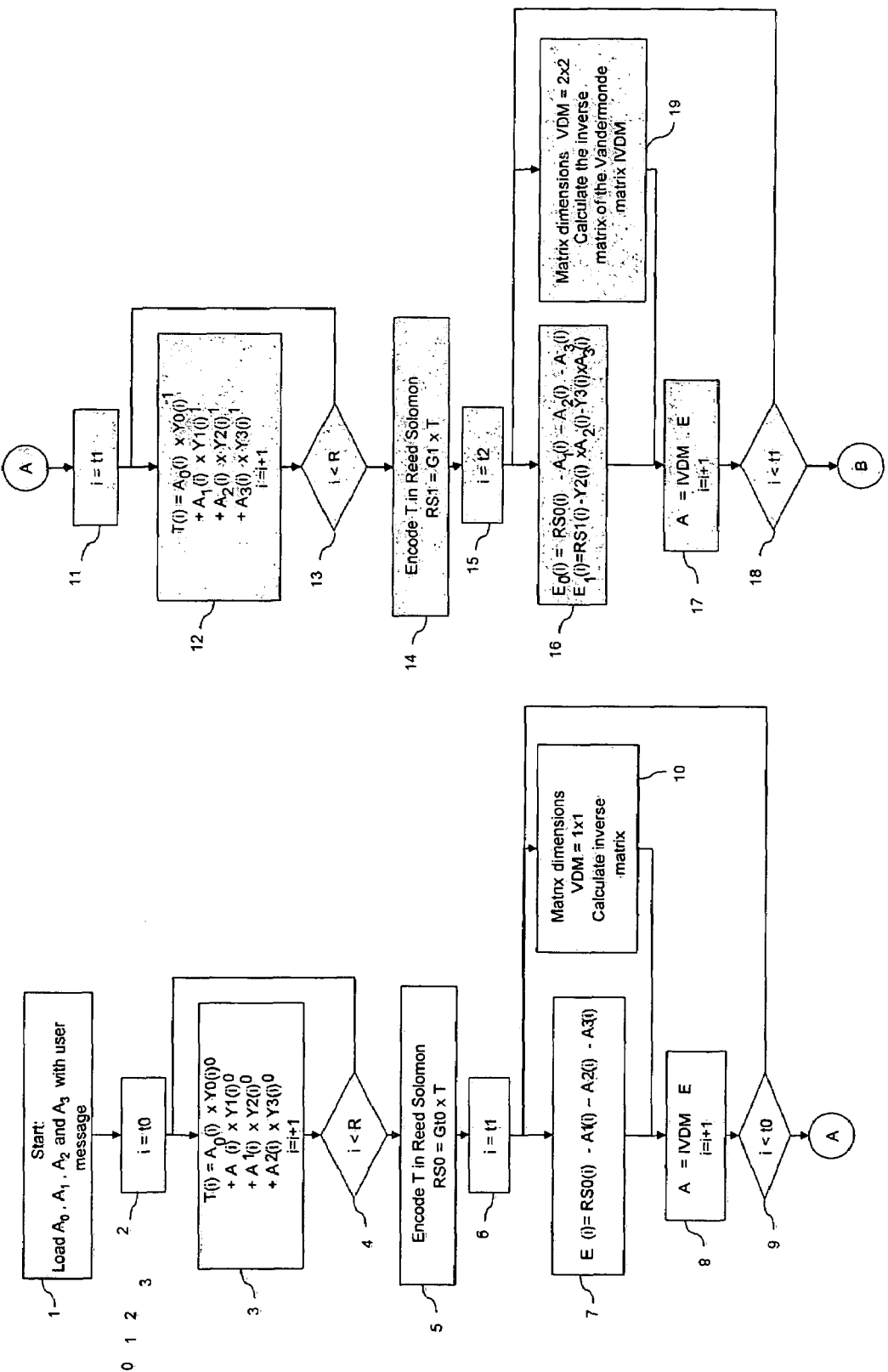
Figure 7B:
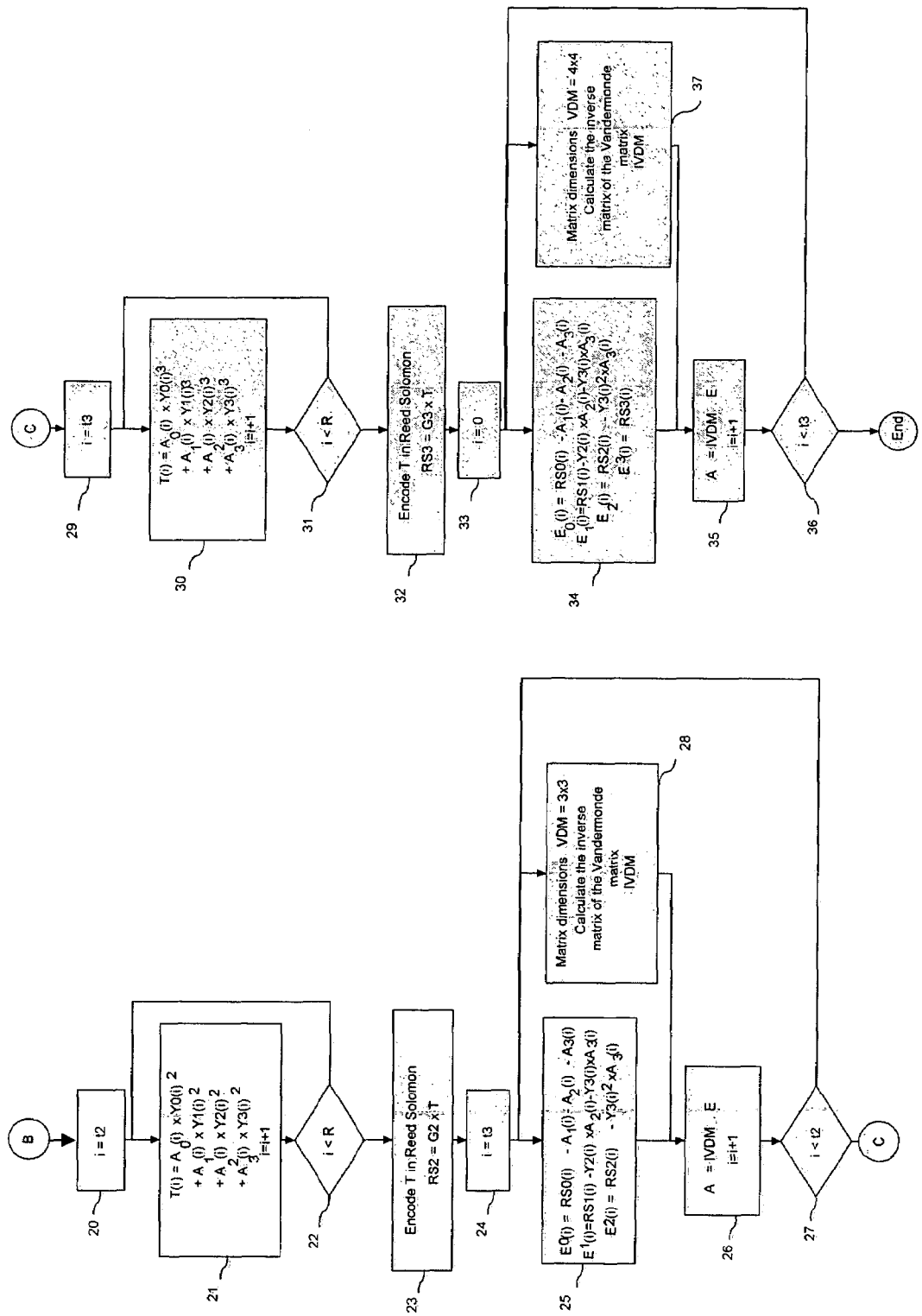
Figure 8A:
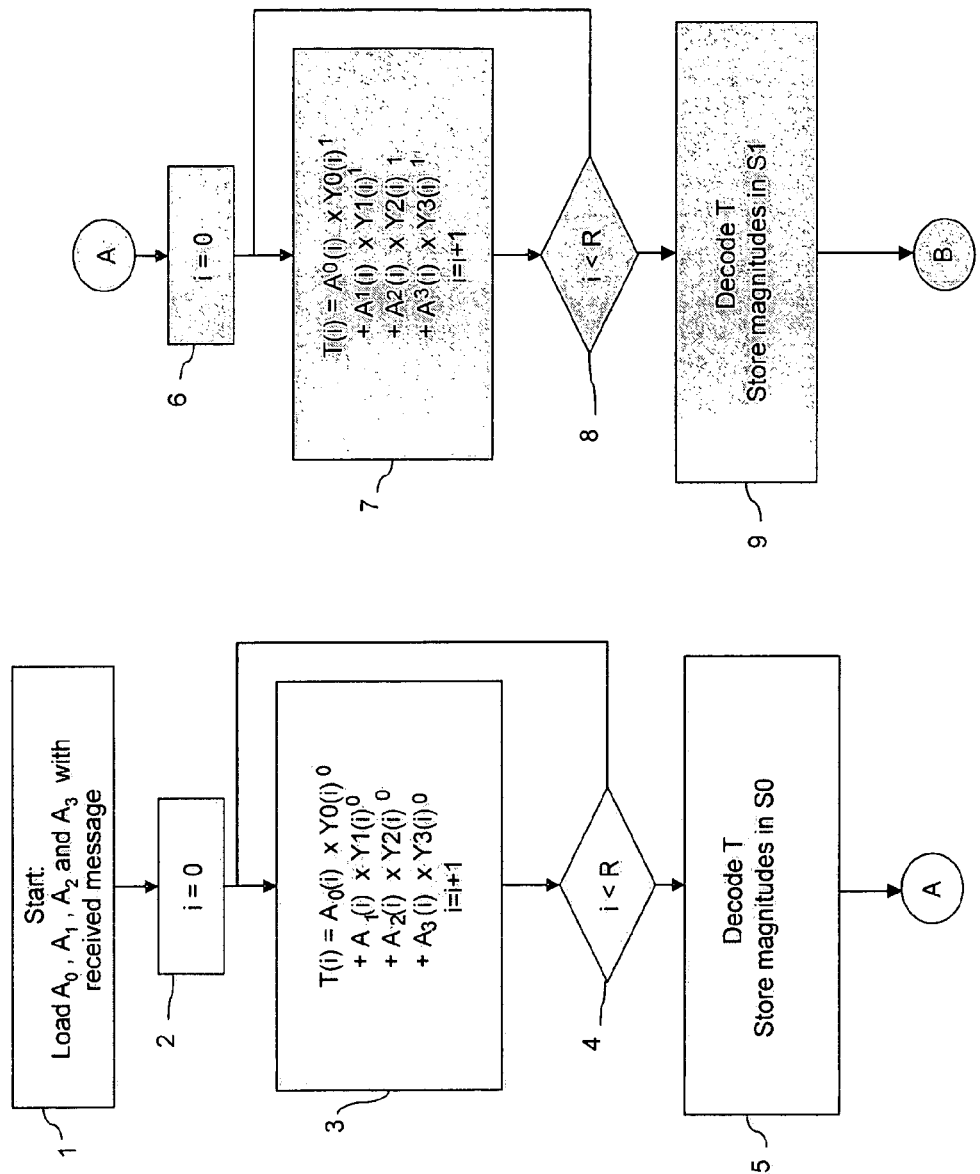
Figure 8B:
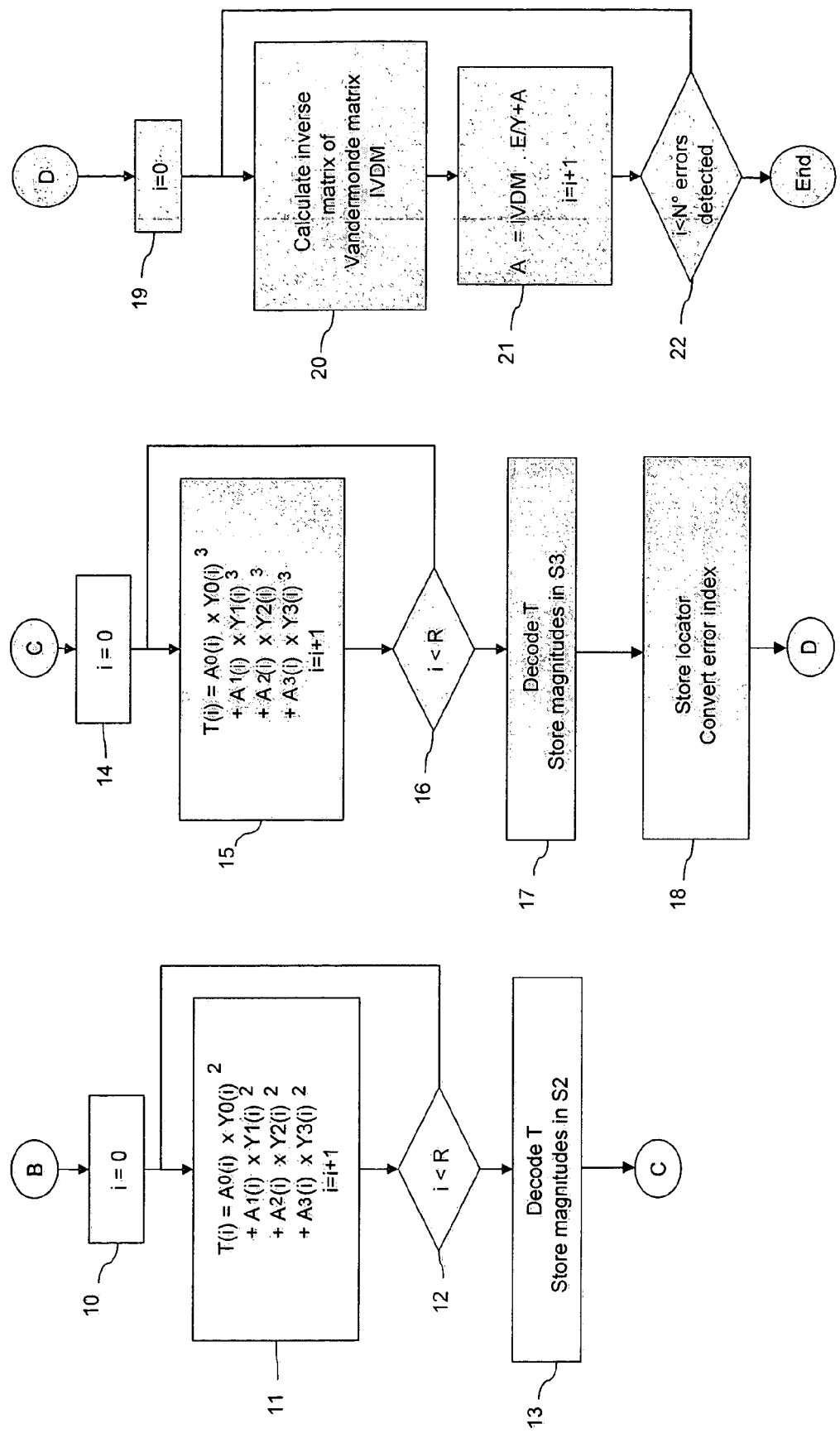
Figure 9A:
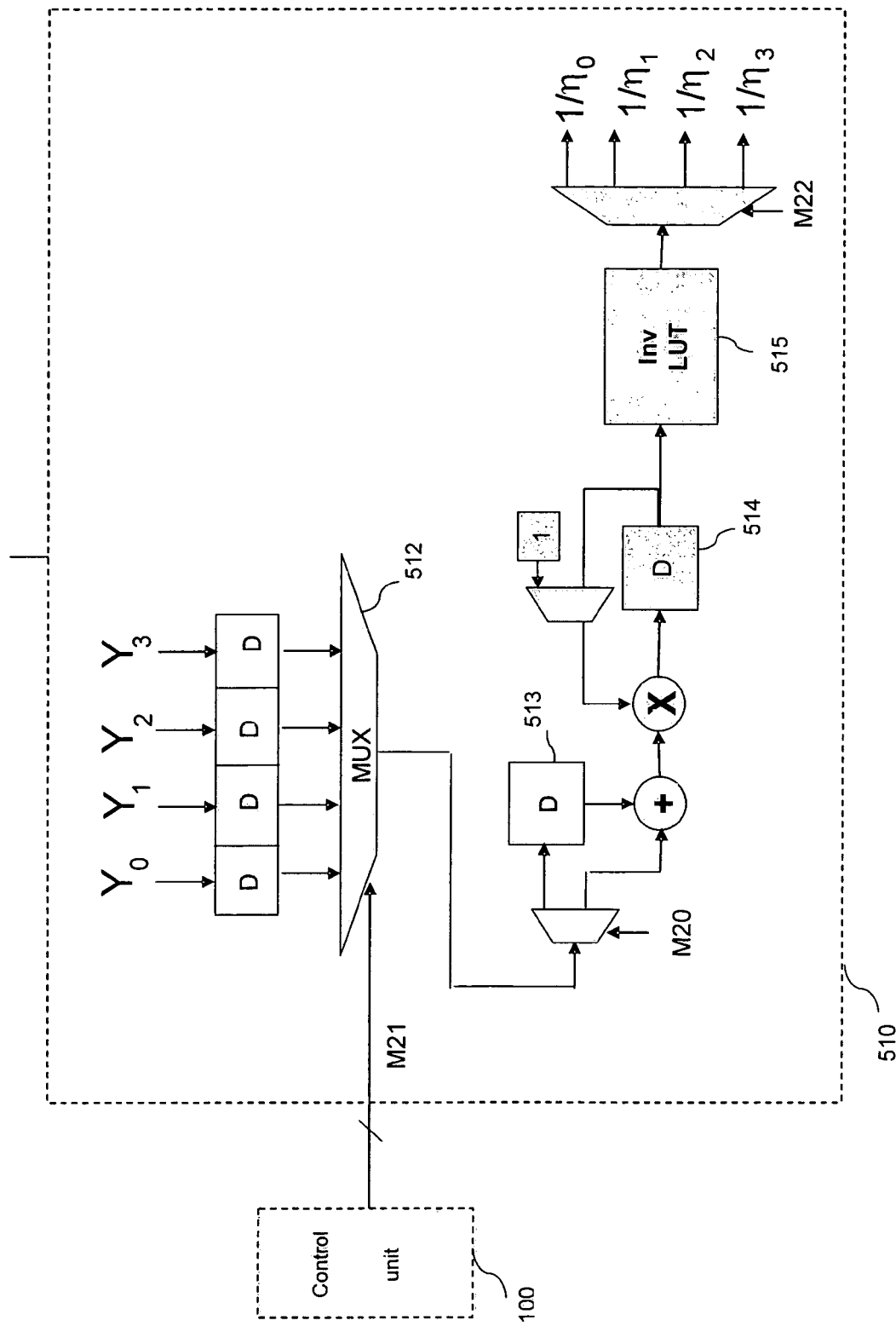
Figure 9B:
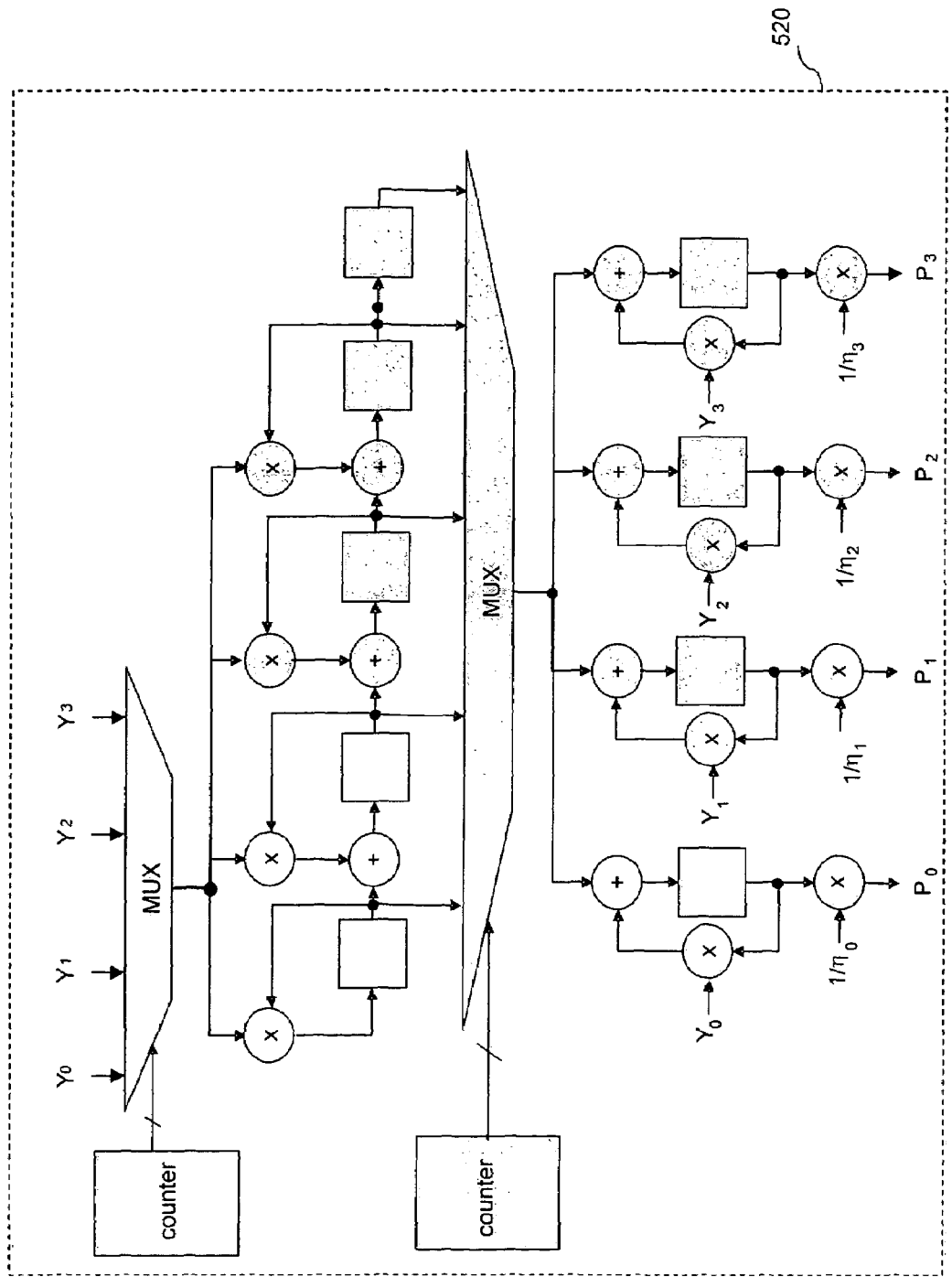
Figure 10:
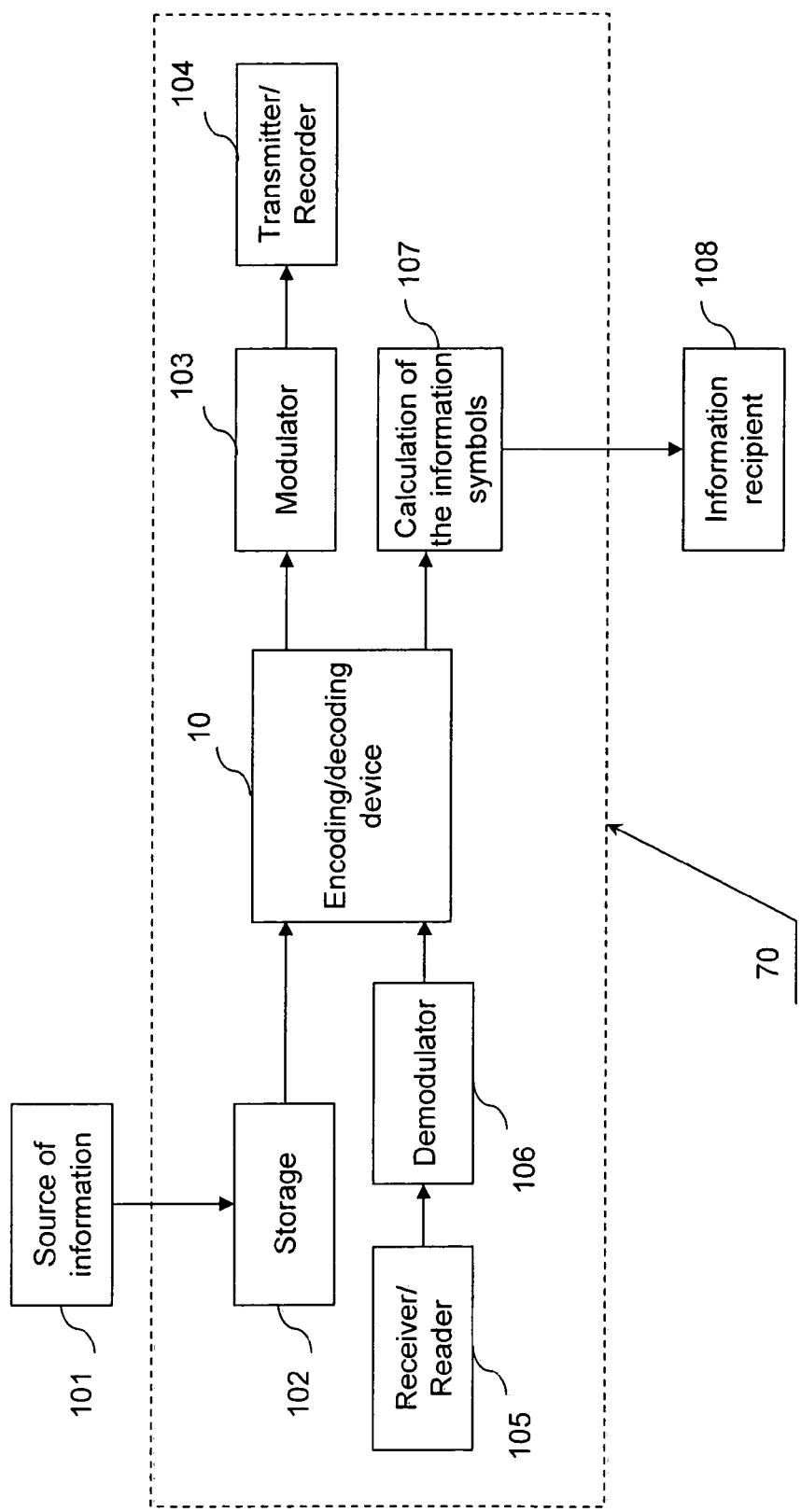

Other aspects and advantages of the invention will emerge from a reading of the following detailed description of particular embodiments, given by way of non-limiting example. The description refers to the accompanying drawings, in which:

FIG. 1 illustrates the general architecture of the device according to the invention, FIG. 2 illustrates the pre-processing unit of that device, FIG. 3 illustrates an embodiment of the memory elements of said pre-processing unit, FIG. 4 illustrates a conventional Reed-Solomon encoder/decoder, FIG. 5 illustrates a post-processing unit of the device according to the invention, FIG. 6 illustrates the control unit of that device, FIGS. 7a and 7b illustrate an encoding algorithm which can be used by the device according to the invention, FIGS. 8a and 8b illustrate a decoding algorithm which can be used by the device according to the invention, FIGS. 9a and 9b illustrate a conventional unit serving to calculate the inverse of a square Vandermonde matrix, and FIG. 10 illustrates an encoded digital signal sending/receiving or recording/reading apparatus comprising a device according to the invention.

An embodiment of the invention will now be described in which an encoding method will be implemented as described in the application FR-0301546, and a decoding method as described in the application FR-0304767; these methods were succinctly described above.

Moreover, by way of illustration, let $q=2^M$ (where M is a strictly positive integer) and $p=4$.

Take for example: $M=8$, $t_0=18$, $t_1=16$, $t_2=14$, $t_3=12$, and $R=143$. With $p=4$, this corresponds to codewords of length $4R=572$, and to a redundancy of: $18+16+14+12=60$ symbols, as in the algebraic geometric code example presented above. The dimension $k=512$ of this code corresponds to a size that is frequently used for the magnetic hard disk logic sectors.

In is practical implementation the invention is thus described here with a certain number of advantageous choices taking into account current technical standards. However it is clear that the scope of the invention is much wider, and that it may easily be adapted to shorter frame lengths, or to a Galois field different from the one used.

In the drawings, of which a detailed description will be found below, use has been made of the following conventions.

The registers are considered as being indexed with the zero index to the right, and the relational arrows do not indicate the direction of shift, but simply the input or the output of the data to the registers. The shifts of the registers are always to the right, that is to say gone through with increasing position-X. It should be noted, in passing, that the word "register" designates, throughout the present description, a memory area of low capacity (a few items of binary data) and equally well a memory area of high capacity (for storing a complete program), within a random access memory or read only memory. Preferably, one or other of the following memory storage means will be envisaged: according to a first embodiment, each register stores a whole number of symbols of $F_q$; in this case, the bits making up each symbol may advantageously be processed in parallel; according to a second embodiment, each register stores, for each symbol of $F_q$, the corresponding power of $\gamma$, where $\gamma$ is a primitive $(q-1)^{th}$ root of unity in $F_q$.

The control signals for shifting any particular register "reg" are denoted SRreg (standing for "shift right reg"). For example, SRA1 designates the control signal for shifting the register $A_1$.

The symbols M1, M2 and so forth designate multiplexers. For convenience, the same notation will be used for a multiplexer and for the signal which controls it.

Finally, clock signals and reset signals have been deliberately omitted in order to render the drawings more legible.

In terms of hardware, the operations "addition" and "multiplication" are performed conventionally. The "addition" circuits are simply "exclusive or" gates applied bit after bit to the symbols represented in the form of bit strings. Thus, in the field $F_{16}$ generated by the polynomial $(X^4+X+1)$, $(y^7+y^1)$ is written: $(1011)+(0010)$, and has the value $(1001)$, which corresponds to $\gamma^{14}$.

Two cases of multiplication are distinguished: general multiplication and the multiplication by a constant.

Multiplication by a constant is involved when one of the operands is defined in advance. The circuits for multiplications by a constant are in fact a series of "exclusive or" gates organized over the M bits representing the constant. Multiplication is considered as a series of additions.

To perform a multiplication by a constant, the circuits are simple. For example, if the multiplier is $\gamma^5$ in $F_{16}$, and the bits B0 to B3 form the multiplicand, bits A0 to A3 of the product are:

A0<=B2 XOR B3,

A1<=B0 XOR B2,

A2<=B0 XOR B1 XOR B3, and

A3<=B1 XOR B2.

A general multiplication cell example is $C=A \cdot B$, where neither A nor B are defined in advance: The calculation of that multiplication in $F_{16}$ may be expressed in $F_2$ (given that $16=2^4$) by using the matrix notation:

$$C = \begin{bmatrix} C0 \\ C1 \\ C2 \\ C3 \end{bmatrix} = \begin{bmatrix} A0 & A3 & A2 & A1 \\ A1 & A0+A3 & A2+A3 & A1+A2 \\ A2 & A1 & A0+A3 & A2+A3 \\ A3 & A2 & A1 & A0+A3 \end{bmatrix} \begin{bmatrix} B0 \\ B1 \\ B2 \\ B3 \end{bmatrix}.$$

Addition is expressed by an "exclusive or" gate, and multiplication or juxtaposition by an "and" gate. The complexity of a general multiplication is approximately M times greater than a multiplication by a constant.

FIG. 1 describes the general architecture of the device 10 according to the invention. This device 10 comprises four main units:

an encoding/decoding unit 200, a pre-processing unit 400, a post-processing unit 300, and a control unit 100.

The control unit 100 organizes the succession of operations. The pre- and post-processing units perform the steps, described above, of the methods of encoding and decoding considered. In conventional manner, unit 200 implements the encoding and decoding of the Reed-Solomon codes of length $(q-1)$ and redundancy $t_l$ (where $l=0, \ldots, p-1$) (see Equation (1)).

FIG. 2 shows the architecture of the pre-processing 400.

Four shift registers of R symbols with M symbols each named $A_0$ to $A_3$ (respectively 420, 430, 440 and 450) are used to store:

either information symbols at the time of operation as encoder, or symbols received or read at the time of use as transmission error corrector.

When it is a message to encode, register $A_0$ 420 receives $(R-t_0)$ symbols, register $A_1$ 440 receives $(R-t_1)$ symbols, register $A_2$ 430 receives $(R-t_2)$ symbols, and register $A_3$ 450 receives $(R-t_3)$ symbols. When it is a received message, the four registers receive R symbols each of M bits.

To clarify the diagrams, the system for loading these registers has been omitted. It is obvious for the person skilled in the art that the latter may be performed in series or in parallel mode, one by one or as a group.

The frame of $(4R-t_0-t_1-t_2-t_3)$ symbols of M bits (on encoding) or of 4R symbols of M bits (on decoding) is thus split into four sub-frames.

Four groups 410, 411, 412, 413 of memory registers that are addressable in series contain the coefficients of the diagonals of the matrices $Y_l$, these coefficients being raised to various powers.

This memory is here a read only memory (ROM), but, as a variant, it could be random access memory (RAM) if, for example, the encoder was used as a peripheral circuit of a microprocessor.

A first possible manner of grouping the memories is the following: a group of four registers contains the coefficients of the diagonals of matrices Y of power 0, a group of four registers contains the coefficients of the diagonals of matrices Y of power 1, a group of four registers contains the coefficients of the diagonals of matrices Y of power 2, and a group of four registers contains the coefficients of the diagonals of matrices Y of power 3. The registers containing the coefficients of the diagonals of matrices Y of power 0 are virtual, since multiplication by the number one is involved; they are mentioned here for reasons of clarity, in order to emphasize the systematic aspect of the architecture.

Another possible manner of grouping the memories is according to the matrix to which they are attached. In FIG. 2, the group 410 is the group formed of the memories containing the elements of the diagonal of the matrices $Y_0, Y_0^0, Y_0^2$, and $Y_0^3$. The group 411 is the group formed of the memories containing the elements of the diagonal of the matrices $Y_1$, $Y_1^0, Y_1^2$, and $Y_1^3$, and so forth.

In general terms, it is a matter of ensuring that the coefficients Y and the word to encode or decode are arranged following the position-X, and this occurs naturally by means of shift registers.

The circuit as illustrated makes it possible to perform a certain number of operations in parallel. It is of course possible to replace the registers in series by parallel registers and to perform multiplications and additions within a single clock pulse on the entirety of the data; this variant enables faster processing, but at the price of a certain increase of the number of necessary components.

The pre-processing unit 400 also contains 16 multipliers and 8 adders (all over M bits if the field used is $F_{2^M}$).

Another manner of producing circuits 410, 411, 412 and 413 is illustrated in FIG. 3. The R symbols of M bits which constitute a diagonal of one of the matrices Y are multiplexed by two general multipliers of M bits (415 and 416). A counter 414 makes it possible to create the address i of Y(i). It therefore counts from 0 to (R−1) (naturally, it is perfectly possible as a variant to choose a decrement from (R−1) to zero). A multiplexer makes it possible to choose the value 1 ($Y^0(i)$) or else Y(i), or else $Y^2(i)$ or else $Y^3(i)$. In this case, calculations in parallel cannot be performed with a single circuit. This circuit is optimal in terms of number of gates, but in exchange it is not optimal in speed of execution. Other variants are possible, according to the execution speed/number of gates compromise that it is sought to achieve.

Each of the symbols of M bits of the four sub-frames may thus be multiplied by the corresponding symbol which belongs to the diagonal of the corresponding matrix Y.

FIG. 4 gives an example embodiment of unit 200 which contains a Reed-Solomon encoder 210 and a Reed-Solomon decoder 220. These two units are entirely in accordance with the prior art, and will only be described summarily here (for this reference may for example be made to the thesis by E. Mastrovito entitled "*VLSI architecture for Computations in Galois Field*", University of Linkoping, 1991, or to the article by A. Hasan et al. entitled "*Algorithm and architectures for a VLSI Reed-Solomon Codec*" in "*Reed-Solomon Codes and Their Applications*" published by S. Wicker and V. Bhargava, IEEE Press 1994, or to the article by G. Seroussi entitled "*A systolic Reed Solomon Encoder*", IEEE Transactions on Information Theory, vol. 37 n° 4, Jul. 1991, or to the patent U.S. Pat. No. 4,958,348).

The encoding may, in known manner, be performed by multiplying each information word by a generator matrix $G_l$ (l=0, . . . , p−1), of corresponding dimension $(q-1-t_l) \times (q-1)$, (each satisfying $H^{(t_l)} \cdot G_l^T = 0$). The encoder may be created as a set of p independent encoders, each associated with a respective value of $t_l$, or as a sole encoder associated with a general generator matrix provided with an parameter that is adjustable depending on the value of $t_l$ considered. The parities are obtained from weighted sums of the sub-frames.

Similarly, the decoder may be created as a set of p independent decoders, each associated with a respective parity check matrix $H^{(t_l)}$ of dimension $t_l \times (q-1)$, or as a sole decoder associated with a general parity check matrix $H^{(t_l)}$ of which the number of lines is adjustable depending on the value of $t_l$ considered. In both cases, it is the weighted sum of the sub-frames which will be multiplied by the parity control matrix to form the error syndrome. The syndrome could for example be calculated, and then the Berlekamp-Massey be applied to obtain an error locating polynomial, and then a Chien, search be applied to determine the roots of that locating polynomial. These roots are the inverse of the positions with erroneous values in the frame. The Forney algorithm will then enable the magnitude of these errors to be calculated.

The article by G. Seroussi and the patent U.S. Pat. No. 4,958,348 mentioned above indicate "systolic" forms of the encoder and of the decoder, which use a sequential method instead of a method with loops; these forms are advantageous in that they do not necessitate additional memory storage. It is nevertheless to be noted that the registers of the device 10 that have not yet been used may be used on the occasion of the encoding and decoding to make a further saving in terms of numbers of gates.

A multiplexer 230 makes it possible to choose which of the four sub-frames must be taken into account to be encoded or decoded. Another multiplexer 240 makes it possible to choose the encoding operation or the decoding operation.

Four shift registers $S_0, S_1, S_2$ and $S_3$ (respectively 280, 285, 290 and 295) are necessary to temporarily store the data before encoding or after decoding. It should be noted that generally a decoder for a Reed-Solomon code gives an item of information as to the magnitude of the error and as to its position. The information on the position must be directed to the control unit 100 in order to be transformed there (as explained below with respect to FIG. 6), in case the indications given by the decoder are not appropriate due to the fact that the frame has been shortened to a number R of symbols less than q. The magnitudes of the errors are stored in the registers $S_0$ to $S_3$. A multiplexer 260 makes it possible to direct the encoded data or the error magnitudes to the multiplexer 250, which enables the choice to be made of the register $S_0$, $S_1$, $S_2$ or $S_3$. It will also be noted that the multiplexers 250 and 260 may be omitted in a variant in which the 4 registers are constituted by a sole shift register.

FIG. 5 describes the post-processing unit 300. For an encoding operation, the encoded data are stored in the registers $S_0$ to $S_3$ of the encoding and decoding unit. In FIG. 5, the registers which are indicated in dashed line are registers which are physically within the other units; they are reproduced here for ease of understanding. For a decoding operation, the magnitudes of the errors detected are stored in the registers $S_0$ to $S_3$.

The post-processing unit 300 principally contains a unit for calculation of a matrix that is the inverse of a Vandermonde matrix 500. Thus unit will be described in detail further on. The post-processing unit 300 also contains four addressable memories (respectively bearing the reference numbers 320, 321, 322, et 323) which each contain R=143 symbols (in the numerical example presented above) that are the inverse of the matrix symbols $Y_0$, $Y_1$, $Y_2$ and $Y_3$. The post-processing unit 300 also performs the general operations of multiplication and addition.

The multiplexer 310 enables the register $S_0$, $S_1$, $S_2$, or $S_3$ to be chosen for the post-processing.

In the case of the encoding (for detailed explanations, reference may be made to the application FR-0301546), removal must be made from the redundancy symbols in $S_0$ of the contributions corresponding to the sub-frames $A_1$, $A_2$ and $A_3$ on calculation of the parities of $A_0$. Next the values of $A_2 \cdot Y_2$ and $A_3 \cdot Y_3$ must be removed from the register $S_1$ for the calculation of the parities of $A_1$, and then the values of $A_3 \cdot Y_3^2$ must be removed from the register $S_2$ for the calculation of the parities of $A_3$.

For these operations, the registers 430, 440 and 450 are used, as well as the multiplexers 311, 312 and 313.

The linear system of equations (2) must then be solved. This system of equations may be solved by inversing a Vandermonde matrix using the coefficients of the matrices $Y_0$, $Y_1$, $Y_2$ and $Y_3$ corresponding to the address of the parity elements. Thus, for the parities contained in the register $S_0$ at the addresses 0 to $t_0$, it is the coefficients $Y_0(0)$, $Y_1(0)$, $Y_2(0)$, and $Y_3(0)$ which are used for the calculation of the matrix, and then the coefficients $Y_0(1)$, $Y_1(1)$, $Y_2(1)$, and $Y_3(1)$, and so forth.

The choice is left to the person skilled in the art to organize the registers by putting the parities at the least significant addresses, and then the user data at the most significant addresses, or the contrary: this has only little or no influence on the complexity of implementation.

The result of the calculation of the matrix is next multiplied: by the result of the preceding operation. As it is a matrix vector multiplication, but performed matrix line by matrix mine, a buffer register 316 is necessary to store the intermediate results, then the multiplexer 315 enables the corresponding register A to be addressed.

Still in the case of the encoding, the memories 320, 321, 322 and 323 are not used. The multiplexers 330, 331, 332 and 333 are also positioned so as to not to add the parities to the content of the register.

In the case of the decoding, it is not required to remote the contributions calculated previously. The multiplexers 311, 312 and 313 then put a zero opposite the corresponding addition operations. The results of the decodings present in the registers $S_0$, $S_1$, $S_2$ and $S_3$ are directly multiplied by the inverse matrix of the Vandermonde matrix formed from the coefficients of the matrices $Y_0$, $Y_1$, $Y_2$ and $Y_3$ corresponding to the address of the elements of the frame which are erroneous. In this case, it is necessary to multiply the results obtained in the vector matrix multiplication by the values stored in the memories 320, 321, 322 and 323 before modifying the register A, this time by addition.

FIG. 6 represents the control unit 100, which may be produced, for example, in the form of a data processing device capable of being controlled by a computer program, or in the form of an Application Specific Integrated Circuit (ASIC) or as a Field Programmable Gate Array (FPGA).

This control unit 100 contains a "state machine" 120 organizing the activation and deactivation of all the signals driving the encoding and decoding operations, for example in shift registers and/or multiplexers. The positioning of the multiplexers is deliberately omitted (to avoid cluttering the drawing) as it may easily be deduced from the description of the circuits. Similarly, to perform certain operations, a certain number of shifts of the registers are necessary. They are indicated by an increment of the value i, and implemented in the form of counters which may possibly be independent.

As inputs, the control unit 100 accepts a signal indicating whether the operation is encoding or decoding. It also accepts a group of signals of M bit symbols indicating the positions of the erroneous symbols coming from the Reed-Solomon decoder as well as their number.

The control unit 100 also contains a "conversion-X table" 110, which places the positions-X of any register of length R opposite the corresponding value of $x_j$. This is because the decoder 220 indicates positions of errors with respect to a frame comprising (q−1) components; when R<q−1, in order to shift the register A which must be updated, it is necessary to take into account the missing positions.

If the address formed by the code does not correspond to a position-X, it is known that the decoding is erroneous, which may for example occur if the number of errors exceeds the error correction capability of the code. This indication is very useful and constitutes an advantage of this method with respect to the conventional Reed-Solomon decoding, since, when the code correction capacity is exceeded, the result given by the Berlekamp-Massey decoder here is a locator and a number of detected errors.

A table is then produced using a memory with $2^M$ addresses which contains the M bits of the corresponding position-X if it exists, and the value $2^M$ everywhere where that position-X does not exist. A memory output comparator detects all the bits equal to 1, in which case it activates a "wrong decoding" signal.

FIGS. 7a and 7b describe the succession of the operations for the encoding.

Step 1 is the commencement of the encoding algorithm. As explained above, the registers $A_0$, $A_1$, $A_2$ and $A_3$ must be loaded with respectively (R−$t_0$) symbols of M bits, (R−$t_1$) symbols of M bits, (R−$t_2$) symbols of M bits, and (R−$t_3$) symbols of M bits. The person skilled in the art knows that several forms of realization are possible. If the registers $A_0$ to $A_3$ are series registers loadable in parallel, the operation may be independent from the control unit. If the registers are loaded in series, the control unit may be used to produce the necessary clock pulses.

Next, at step 2, the registers $Y_0^0$, $Y_1^0$, $Y_2^0$, and $Y_3^0$ are placed opposite the registers $A_0$, $A_1$, $A_2$ and $A_3$ (by the number of shifts corresponding to $t_0$), in order that the multiplications of the user data by the corresponding factors can be performed at step 3.

The position-X i is incremented up to the value (R−1) (test 4), and each new shift provides an item of data to the Reed-Solomon encoder. If the encoder were to be systolic, step 5 would be included in the loop. Here an encoder is considered as having storage registers and as performing the encoding operations when the frame is ready (step 5). Once this encoding operation has been carried out, attention is turned to the values in the register $S_0$ which are between position $t_1$ and position $t_0$.

The control unit thus shifts the register $S_0$ at step 6 in order for the item of data indexed $t_1$ to be available. The control unit also shifts the registers $A_1, A_2,$ and $A_3$ at step 6 in order for the data indexed $t_1$ to be available. At each simultaneous shift of registers $S_0, A_1, A_2,$ and $A_3$ it is thus possible to present (step 7) the result $S_0(i) - A_1(i) - A_2(i) - A_3(i)$ as a vector element that must be multiplied by the inverse matrix of the Vandermonde matrix at step 8.

The inverse of the Vandermonde matrix is calculated in parallel at step 7. It is to be noted that the series considered here is of dimension 1×1 and value 1. The control unit directs the result solely to register $A_0$. At step 9, the $(t_0-t_1)$ shifts are carried out. In register $A_0$, the results of the matrix vector multiplication, which will form the data necessary for the following calculation, are then found at the right positions.

At step 11, the registers $Y_0^1, Y_1^1, Y_2^1,$ and $Y_3^1$ are placed opposite the registers $A_0, A_1, A_2$ and $A_3$ (by the number of shifts corresponding to $t_1$), in order that the multiplications of the information symbols by the corresponding factors can be performed at step 12 as previously. The position-X i is incremented up to the value (R−1) (test 13), and each new shift again provides an item of data to the Reed-Solomon encoder.

After the encoding at step 14, attention is turned to the values in the register $S_1$ which are between position-X $t_2$ and position-X $t_1$. The control unit thus shifts the register $S_1$ at step 15 in order for the item of data indexed $t_2$ to be available. The control unit also shifts the registers $A_2, Y_2$ and: $A_3, Y_3$ at step 14 in order for the data indexed $t_2$ to be available. Thus at each simultaneous shift of registers $S_0, A_1, A_2,$ and $A_3$ the control unit may present (step 16) the result $S_0(i) - A_1(i) - A_2(i) - A_3(i)$ as first element of the vector that must be multiplied by the inverse matrix of the Vandermonde matrix at step 17.

Next (still at step 16), without shifting, but by multiplexing, the control unit may present the result $S_1(i) - A_2(i) \cdot Y_2(i) - A_3(i) \cdot Y_3(i)$ as second element of the vector that must be multiplied by the inverse matrix of the Vandermonde matrix at step 17.

The inverse of the Vandermonde matrix is calculated in parallel at step 19. For this iteration, the latter here is of dimension 2×2. The data to be provided are $Y_0(i)$ and $Y_1(i)$. The control unit directs the result of the vector matrix multiplication solely to the registers $A_0$ and $A_1$. At step 18, the $(t_1-t_2)$ shifts are carried out. In registers $A_0$ and $A_1$, the resulting coefficients of the matrix vector multiplication of step 17, which will form the data necessary for the following calculation, are then found at the right positions.

At step 20, the registers $A_0^2, Y_1^2, Y_2^2,$ and $Y_3^2$ are placed opposite the registers $A_0, A_1, A_2$ and $A_3$ (by the number of shifts corresponding to $t_2$), in order that the multiplications of the information symbols by the corresponding factors can be performed at step 21. The position-X i is incremented up to the value (R−1) (test 22), and each new shift again provides an item of data to the Reed-Solomon encoder.

The result of the encoding is stored in register $S_2$. After the encoding at step 23, attention is then turned to the values in the register $S_2$ which are between position $t_3$ and position $t_2$. The control unit thus shifts the register $S_2$ at step 24 in order for the item of data indexed $t_3$ to be available.

The control unit also shifts the registers $A_3$ and $Y_3$ at step 24 in order for the item of data indexed $t_3$ to be available. Thus at each simultaneous shift of registers $S_0, A_1, A_2,$ and $A_3$ the control unit may present (step 25) the result $S_0(i) - A_1(i) - A_2(i) - A_3(i)$ as first element of the vector that must be multiplied by the inverse matrix of the Vandermonde matrix at step 26.

Next, without shifting, but by multiplexing, the control unit may present the result $S_1(i) - A_2(i) \cdot Y_2(i) - A_3(i) \cdot Y_3(i)$ as second element of the vector that must be multiplied by the inverse matrix of the Vandermonde matrix at step 26. Next, by multiplexing, the control unit may present the result $S_2(i) - A_3(i) \cdot Y_3^2(i)$ as last element of the vector that must be multiplied by the inverse matrix of the Vandermonde matrix at step 26.

The inverse of the Vandermonde matrix is calculated at step 28 in parallel with step 25. For this iteration, this matrix is of dimension 3×3. The data to be provided are $Y_0(i), Y_1(i)$ and $Y_2(i)$. The control unit directs the result of the vector matrix multiplication solely to the registers $A_0, A_1$ and $A_2$. At step 27, the $(t_2-t_3)$ shifts are carried out. In registers $A_0, A_1$ and $A_2$, the results of the matrix vector multiplication of step 26, which will form the data necessary for the following calculation, are then found at the right positions.

At step 29, the. registers $Y_0^3, Y_1^3, Y_2^3,$ and $Y_3^3$ are placed opposite the registers $A_0, A_1, A_2$ and $A_3$ (by the number of shifts corresponding to $t_3$), in order that the multiplications of the information symbols by the corresponding factors can be performed at step 30. The position-X i is incremented up to the value (R−1) (test 31), and each new shift again provides an item of data to the Reed-Solomon encoder.

The result of the encoding is stored in register $S_3$. After the encoding at step 32, attention is then turned to the values in the register $S_3$ which are between position 0 and position $t_3$. The control unit thus shifts the register $S_3$ at step 33 in order for the item of data indexed 0 to be available. The control unit also shifts the registers $A_3$ and $Y_3$ at step 33 in order for the data indexed 0 to be available.

Thus at each simultaneous shift of registers $S_0, A_1, A_2,$ and $A_3$ the control unit may present (step 34) the result $S_0(i) - A_1(i) - A_2(i) - A_3(i)$ as first element of the vector that must be multiplied by the inverse matrix of the Vandermonde matrix at step 35.

Next, without shifting, but by multiplexing, the control unit may present the result $S_1(i) - A_2(i) \cdot Y_2(i) - A_3(i) \cdot Y_3(i)$ as second element of the vector that must be multiplied by the inverse matrix of the Vandermonde matrix at step 35. Next, by multiplexing, the control unit may present the result $S_2(i) - A_3(i) \cdot Y_3^2(i)$ as third element of the vector that must be multiplied by the inverse matrix of the Vandermonde matrix at step 35. Next, by multiplexing, the control unit may present the result $S_3(i)$ as fourth and last element of the vector that must be multiplied by the inverse matrix of the Vandermonde matrix at step 35.

The inverse of the Vandermonde matrix is calculated at step 37 in parallel with step 34. For this iteration, this matrix is of dimension 4×4. The data to be provided are $Y_0(i), Y_1(i), Y_2(i)$ and $Y_3(i)$. The control unit directs the result of the vector matrix multiplication solely to the registers $A_0$ and $A_1$. At step 36, the $t_3$ shifts are carried out. In registers $A_0, A_1, A_2$ and $A_3$, the result of the matrix vector multiplication of step 35 is then found at the right positions, and the complete result of the encoding is obtained.

With reference to FIGS. 8a and 8b, the correction or errors and/or erasures will now be described.

Step 1 is the commencement of the decoding algorithm. At this step, the registers $A_0$, $A_1$, $A_2$ and $A_3$ must all be loaded with R symbols of M bits. The person skilled in the art knows that several forms of realization are possible. If the registers $A_0$ to $A_3$ are series registers loadable in parallel, the operation may be independent from the control unit. If the registers are loaded in series, the control unit may be used to produce the necessary clock pulses.

At step 2, the registers $A_0$, $A_1$, $A_2$ and $A_3$ are respectively placed opposite the registers $Y_0^0$, $Y_1^0$, $Y_2^0$, and $Y_3^0$. Step 3 consists of multiplying A(i) by $Y_0$(i), and adding the results in order to form, after R shifts (test 4), a word of R symbols which will be submitted to the Reed-Solomon decoder at step 5. The error magnitudes obtained are stored in register $S_0$. It is not necessary to save the error positions at this first decoding.

At step 6, the registers $A_0$, $A_1$, $A_2$ and $A_3$ are respectively placed opposite the registers $Y_0^1$, $Y_1^1$, $Y_2^1$, and $Y_3^2$. Step 7 consists of multiplying A(i) by $Y^1$(i), and adding the results in order to form, after R shifts (test 8), a word of R symbols which will be submitted to the Reed-Solomon decoder at step 9. The error magnitudes obtained are stored in register $S_1$. It is not necessary to save the error positions for this second decoding.

At step 10, the registers $A_0$, $A_1$, $A_2$ and $A_3$ are respectively placed opposite the registers $Y_0^2$, $Y_1^2$, $Y_2^2$, and $Y_3^2$. Step 11 consists of multiplying A(i) by $Y^2$(i), and adding the results in order to form, after R shifts (test 12), a word of R symbols which will be submitted to the Reed-Solomon decoder at step 13. The error magnitudes obtained are stored in register $S_2$. It is not necessary to save the error positions at this third decoding.

At step 14, the registers $A_0$, $A_1$, $A_2$ and $A_3$ are respectively placed opposite the registers $Y_0^3$, $Y_1^3$, $Y_2^3$, and $Y_3^3$. Step 15 consists of multiplying A(i) by $Y^3$(i), and adding the results in order to form, after R shifts (test 16), a word of R symbols which will be submitted to the Reed-Solomon decoder at step 17. The error magnitudes obtained are stored in register $S_3$. It is necessary to save the positions of errors on the occasion of this last decoding; this may be performed in the control unit 100, where the addresses are converted into positions-X and where the "wrong decodings" are detected (step 18).

The linear system of equations (4) must then be solved. For this, the calculation of the inverse matrix of the Vandermonde matrix must be performed, with as inputs the values of the matrices $Y_0$, $Y_1$, $Y_2$ and $Y_3$ which correspond to the positions-X detected as erroneous.

At step 19 a counter is reset to zero. The stop for this counter is the number of errors detected (test 22). The calculation of the inverse matrix (step 20) is then used based on the calculation of the values $Y_0$, $Y_1$, $Y_2$ and $Y_3$ corresponding to the position-X of the error processed.

At step 21, this matrix is multiplied by the vector stored in the four registers $S_0$, $S_1$, $S_2$ and $S_3$ which store the magnitudes obtained by the decoding operations; it is then necessary to divide the result obtained by $Y_0$, $Y_1$, $Y_2$ or $Y_3$ to obtain the values which must be added to the registers $A_0$, $A_1$, $A_2$ or $A_3$.

FIGS. 9a and 9b show unit 500 serving to calculate the inverse of a square Vandermonde matrix. It may be recalled that a square Vandermonde matrix V is of the form $$V \equiv \begin{bmatrix} 1 & 1 & \cdots & 1 \\ \lambda_1 & \lambda_2 & \cdots & \lambda_w \\ \vdots & \vdots & \vdots & \vdots \\ \lambda_1^{w-1} & \lambda_2^{w-1} & \cdots & \lambda_w^{w-1} \end{bmatrix},$$

where the $\lambda_i$ (i=1, ..., w) are all different from each other.

To find the inverse of such a matrix, a set of polynomials is defined:

$$P_i(z) = \prod_{j \neq i} \frac{z - \lambda_j}{\lambda_i - \lambda_j}, \text{ where } i, j = 1, \ldots, w.$$

It can be seen that the polynomial $P_i(z)$ cancels out for $z=\lambda_j$ for all $j \neq i$, and has the value 1 for $z=\lambda_i$; consequently, by forming a matrix of which the lines are defined by the coefficients of that polynomial, the inverse is indeed obtained of a Vandermonde matrix. To obtain these coefficients with as few operations to perform as possible, the following polynomial may be used:

$$F(z) = \prod_{j=0}^{w-1} (z - \lambda_j),$$

and define $$\eta_i \equiv \prod_{i \neq j} (\lambda_i - \lambda_j).$$

We then have:

$$P_i(z) = \frac{1}{\eta_i} \frac{F(z)}{z - \lambda_i}.$$

Unit 500 contains two sub-units 510 and 520.

Unit 510 is dedicated to the calculation of the parameters $\eta_0$, $\eta_1$, $\eta_2$ and $\eta_3$. Thanks to the multiplexer 512, the control unit 100 chooses the coefficient Y which must be stored in the register 513. Next the multiplexer driven by the signal M20 orients the other coefficients Y towards the addition (it may be recalled that addition and subtraction are identical operations in a Galois field using $F_2$). The results are multiplied and stored in register 514. The first multiplication is made with the value one. A look-up table 515, that is to say a memory containing the inverse numbers of the numbers present at the addressing, makes it possible to avoid a division operation. A multiplexer makes it possible direct the final value to its destination in unit 520.

Unit 520 calculates the lines of the inverse matrix. The system first of all calculates the polynomial F(z), then divides this polynomial by the coefficients Y in parallel. A multiplication by the coefficients $\eta_0$, $\eta_1$, $\eta_2$ and $\eta_3$ is next performed. It will be noted that the timing of the operations makes it possible to obtain the coefficients of all the lines in parallel, or else the coefficients of each line one after the other, then another line, and so forth.

In this embodiment, the line by line progression is adopted in order to reduce the number of memory registers necessary.

The system is created according to the dimension of the 4×4 matrix which is the maximum dimension of this embodiment. Matrices of dimension 1×1, 2×2, and 3×3 are obtained with the same system, by programming the computers according to the dimension of the matrix.

It can be seen, on the basis of this example with four matrices, that the encoding method just like the decoding method are in fact iterative and structured. It is naturally possible to extrapolate the structure for hyper-matrices constituted by N×N (where N>4) sub-matrices.

FIG. 10 a block diagram of an encoded digital signal sending/receiving or recording/reading apparatus 70, comprising a device 10 according to the invention.

The function of this apparatus is to transmit information of any nature from a source 101 to a recipient or user 108. First of all, the source 101 puts this information into the form of symbols belonging to a certain alphabet (for example bytes of bits in the case in which the size q of the alphabet is 256), and transmits these symbols to a storage unit 102, which accumulates the symbols so as to form sets each containing k symbols. Next, each of these sets is transmitted by the storage unit 102 to the device 10 which, operating as an encoder, constructs a codeword $\underline{v}$ of length n.

The device 10 transmits the codewords $\underline{v}$ to a modulator 103. This modulator 103 associates a modulation symbol with each group of bits of predetermined size according to a certain rule. This could for example be a complex amplitude defined according to the 4-QAM constellation, or 8-DPSK or 16-QAM.

Next, these modulation symbols are transmitted to a recorder, or to a transmitter, 104, which inserts the symbols in a, transmission channel. This channel may for example be storage on an suitable carrier such as a DVD or a magnetic tape, or a wired or wireless transmission as is the case for a radio link.

This transmission, after having been affected by a "transmission noise" whose effect is to modify or erase certain of the transmitted data at random, arrives at a reader or at a receiver 105. The reader or receiver 105 then transmits these elementary symbols to the demodulator 106, which transforms them into symbols of the alphabet $F_q$.

These symbols of $F_q$ are grouped by sequences of n successive symbols, each of these sequences constituting a "received word" $\underline{r}$. That word $\underline{r}$ is next processed by the device 10, which, by implementing a suitable error correcting algorithm, provides an "associated codeword" $\hat{v}$.

Once the correction has been terminated, the associated codeword $\hat{v}$ is transmitted to an information symbols calculation unit 107, which extracts from it k information symbols by performing the inverse of the transformation implemented during the encoding. Finally, these information symbols are supplied to their recipient 108.

The invention claimed is:

1. A device for the encoding of information symbols to transmit or to record, and the correcting errors among the symbols received or read, according to codes defined over a Galois field Fq, where q is an integer greater than 2 and equal to a power of a prime number, and in which a set of elements of Fq are considered which are denoted $y_l(j)$, where j=1, . . . , R with $1 \leq R \leq q-1$ and l=0, . . . , p−1 with p>1, said device comprising:
   a Reed-Solomon encoder;
   a Reed-Solomon decoder;
   a unit serving to calculate the inverse of a Vandermonde matrix;
   registers A in which there are stored
      for the encoding, said information symbols, and
      for the error correction, the symbols received or read after they have been corrected;
   registers S in which there are stored
      for the encoding, the symbols output from said Reed-Solomon encoder, and
      for the correction of errors, the symbols input to said Reed-Solomon decoder; and
   registers Y in which said quantities $y_l(j)$ are stored.

2. A The device according to claim 1, in which said Reed-Solomon decoder is of length (q−1), and further comprising a conversion-X table placing the indices of any register of length R opposite the respective elements of the Galois field Fq.

3. The device according to claim 1 or claim 2, in which in said registers Y the powers $y_l(j)^s$ of the symbols $y_l(j)$, where s=2, . . . , p−1, are also stored.

4. The device according to claim 1 or claim 2, further comprising multiplier circuits calculating the powers $y_l(j)^s$ of the symbols $y_l(j)$, where s=2, . . . , p−1, after the values of those symbols have been read in the registers Y during the post-processing steps.

5. A The device according to claim 1 or claim 2, further comprising a state machine, adapted to organize activation and deactivation of all the signals driving the encoding and error correcting operations.

6. The device according to claim 1 or claim 2, further comprising a control unit in the form of an Application Specific Integrated Circuit (ASIC) or Field Programmable Gate Array (FPGA).

7. The device according to claim 1 or claim 2, further comprising a control unit in the form of a data processing device capable of being controlled by a computer program.

8. A computer program stored in a computer-readable medium, containing instructions adapted to operate said control unit of said device according to claim 7.

9. An apparatus for sending and receiving encoded digital signals, comprising means for modulating the encoded digital signals, a modulated data transmitter, a modulated data receiver, means for demodulating the encoded digital signals, means for calculating estimated information symbols from corrected received words, and a device according to claim 1 or claim 2.

10. An apparatus for recording and reading encoded digital signals, comprising means for modulating the encoded digital signals, a modulated data recorder, a modulated data reader, means for demodulating the encoded digital signals, means for calculating estimated information symbols from corrected read words, and a device according to claim 1 or claim 2.

11. A device for encoding information symbols into a linear code, and for detecting error locations and magnitudes of encoded information symbols of the linear code, comprising:
   a Reed-Solomon encoder, adapted to encode information symbols into a Reed-Solomon codes;
   address conversion means for matching locations of the linear code to locations of the Reed-Solomon code; and
   post-processing means for processing symbols output from said Reed-Solomon encoder,
   wherein said post-processing means comprise a unit for calculating an inverse of a Vandermonde matrix.

12. The device according to claim 11, further comprising:
   a Reed-Solomon decoder, adapted to decode the Reed-Solomon code;

pre-processing means for processing information symbols to be input to said Reed-Solomon encoder and encoded information symbols to be input to said Reed-Solomon decoder; and a command unit adapted to organize activation and deactivation of signals driving the encoding, the decoding, the pre-processing and the post-processing operations.

13. The device according to claim 12, further comprising:

a first register, adapted to store the information symbols or encoded information symbols;

a second register, adapted to store the symbols output from said Reed-Solomon encoder or the symbols input to said Reed-Solomon decoder; and a third register, adapted to store predetermined values of the first linear code.

14. The device according to any one of claims 11 to 13, wherein the linear code is an algebraic geometric code.

15. A device for encoding information symbols into a linear code, comprising:

pre-processing means for performing first operations on information symbols to be encoded and predetermined values of the linear code;

a Reed-Solomon encoder adapted to encode the pre-processed information symbols into a Reed-Solomon code and outputting encoded information symbols; and post-processing means for performing second operations on the information symbols to be encoded, the symbols encoded by said Reed-Solomon encoder and the predetermined values of the linear code;

wherein said post-processing means comprise means for calculating an inverse of a Vandermonde matrix.

16. The device according to claim 15, further comprising:

a plurality of first registers each for storing the information symbols to be encoded;

a plurality of second registers each for storing information symbols encoded by said Reed-Solomon encoder; and a plurality of third registers each for storing the predetermined values of the linear code.

17. The device according to claim 16, wherein said post-processing means is adapted to calculate an inverse of a Vandermonde matrix from values stored in the plurality of third registers.

18. The device according to claim 15, wherein the linear code is an algebraic geometric code.

19. A device for decoding encoded information symbols of a linear code, comprising:

pre-processing means for performing first operations on encoded information symbols to be decoded and predetermined values of the linear code;

a Reed-Solomon decoder, adapted to decode the pre-processed information symbols; and post-processing means for performing second operations on the encoded information symbols to be decoded, the symbols decoded by said Reed-Solomon decoder, and the predetermined values of the linear code;

wherein said post-processing means comprise means for calculating an inverse of a Vandermonde matrix.

20. The device according to claim 19, wherein the linear code is an algebraic geometric code.

21. The device according to claim 19, further comprising:

a plurality of first registers each for storing encoded information symbols to be decoded;

a plurality of second registers each for storing decoded information symbols; and a plurality of third registers each for storing predetermined values of the linear code.

22. The device according to claim 21, wherein said post-processing means is adapted to calculate an inverse of a Vandermonde matrix from values stored in sad the plurality of third registers.

23. A method for encoding information symbols into a linear code, comprising the steps of:

pre-processing the information symbols by performing first operations on the information symbols to be encoded and predetermined values of the linear code;

encoding the pre-processed information symbols into a Reed-Solomon code; and post-processing the encoded information symbols by performing second operations on the information symbols to be encoded, the encoded information symbols, and the predetermined values of the linear code, wherein said step of post-processing includes calculating an inverse of a Vandermonde matrix.

24. A method for decoding encoded information symbols of a linear code, comprising the steps of:

pre-processing the encoded information symbols by performing first operations on the encoded information symbols to be decoded and predetermined values of the linear code;

decoding the pre-processed symbols as a Reed-Solomon code; and post-processing the decoded information symbols by performing second operations on the information symbols to be decoded, the decoded information symbols, and the predetermined values of the linear code, wherein said step of post-processing includes calculating an inverse, of a Vandermonde matrix.

* * * * *

UNITED STATES PATENT AND TRADEMARK OFFICE
CERTIFICATE OF CORRECTION

| | |
|---|---|
| PATENT NO. | : 7,404,134 B2 |
| APPLICATION NO. | : 10/952597 |
| DATED | : July 22, 2008 |
| INVENTOR(S) | : Philippe Le Bars et al. |

It is certified that error appears in the above-identified patent and that said Letters Patent is hereby corrected as shown below:

COLUMN 2:

Line 4, "equal," should read --equal--.

COLUMN 7:

Line 32, "decoding-comprises" should read --decoding comprises--.

COLUMN 9:

Line 46, "In is" should read --In its--.

COLUMN 10:

Line 17, "$(y^7+y^1)$" should read --$(\gamma^7+\gamma^1)$--.

COLUMN 12:

Line 42, "calculated,." should read --calculated,-- and
"Berlekamp-Massey" should read --Berlekamp-Massey algorithm--.

COLUMN 13:

Line 12, "data-are" should read --data are--;
Line 21, "Thus" should read --This--;
Line 24, "et 323)" should read --and 323)--; and
Line 57, "plied: by" should read --plied by--.

COLUMN 19:

Line 13, "FIG. 10" should read --FIG. 10 shows--; and
Line 38, "affected" should read --effected--.

COLUMN 20:

Line 11, "A The" should read --The--.

UNITED STATES PATENT AND TRADEMARK OFFICE
CERTIFICATE OF CORRECTION

| | |
|---|---|
| PATENT NO. | : 7,404,134 B2 |
| APPLICATION NO. | : 10/952597 |
| DATED | : July 22, 2008 |
| INVENTOR(S) | : Philippe Le Bars et al. |

It is certified that error appears in the above-identified patent and that said Letters Patent is hereby corrected as shown below:

<u>COLUMN 22</u>:

Line 48, "inverse," should read --inverse--.

Signed and Sealed this

Twelfth Day of May, 2009

JOHN DOLL
*Acting Director of the United States Patent and Trademark Office*